US010230367B2

(12) United States Patent
Kim et al.

(10) Patent No.: US 10,230,367 B2
(45) Date of Patent: Mar. 12, 2019

(54) ELECTRONIC DEVICE AND METHOD OF DETERMINING TOUCH IN ELECTRONIC DEVICE

(71) Applicant: Samsung Electronics Co., Ltd., Gyeonggi-do (KR)

(72) Inventors: Jin-Man Kim, Gyeongsangbuk-do (KR); Joo-Han Kim, Gyeongsangbuk-do (KR); Jung-Sik Choi, Gyeongsangbuk-do (KR); Chul-Hyung Yang, Gyeongsangbuk-do (KR); Ji-Woo Lee, Gyeongsangbuk-do (KR)

(73) Assignee: Samsung Electronics Co., Ltd. (KR)

( * ) Notice: Subject to any disclaimer, the term of this patent is extended or adjusted under 35 U.S.C. 154(b) by 145 days.

(21) Appl. No.: 15/348,234

(22) Filed: Nov. 10, 2016

(65) Prior Publication Data
US 2017/0134022 A1   May 11, 2017

(30) Foreign Application Priority Data

Nov. 10, 2015  (KR) .......................... 10-2015-0157750
Sep. 19, 2016  (KR) .......................... 10-2016-0119429

(51) Int. Cl.
*G06F 3/041*   (2006.01)
*G06F 3/044*   (2006.01)
(Continued)

(52) U.S. Cl.
CPC ....... *H03K 17/955* (2013.01); *G01R 27/2605* (2013.01); *G06F 1/1698* (2013.01);
(Continued)

(58) Field of Classification Search
CPC ....... H03K 17/955; H03K 2217/94026; H03K 2017/9455; G06F 3/044; G06F 3/0418;
(Continued)

(56) References Cited

U.S. PATENT DOCUMENTS 9,490,885 B1 * 11/2016 Zheng .................. H04W 52/42
2008/0142352 A1    6/2008 Wright
(Continued)

FOREIGN PATENT DOCUMENTS

KR   1020140027893   3/2014
WO   WO 2013/163641  10/2013

OTHER PUBLICATIONS

European Search Report dated Feb. 20, 2017 issued in counterpart application No. 16197416.7-1972, 8 pages.
(Continued)

*Primary Examiner* — Ryan Johnson
(74) *Attorney, Agent, or Firm* — The Farrell Law Firm, P.C.

(57) ABSTRACT

An electronic device and a method a provided. The electronic device includes a first surface, a second surface opposite to the first surface, and a side surface that surrounds at least part of a space between the first and second surfaces; a Radio Frequency (RF) communication circuit; an antenna radiator that forms at least part of at least one of the first surface, the second surface, and the side surface and is connected to the RF communication circuit; a sensor that detects whether an external object contacts the antenna radiator; a switching circuit connected to the antenna radiator and the sensor; and a processor configured to receive a first value from the sensor when the antenna radiator and the sensor are connected to each other and to receive a second value from the sensor when the antenna radiator and the sensor are separated from each other.

17 Claims, 20 Drawing Sheets

(51) Int. Cl.
*H03K 17/945* (2006.01)
*H03K 17/955* (2006.01)
*G01R 27/26* (2006.01)
*G06F 1/16* (2006.01)
*G06F 1/3231* (2019.01)
*G06F 1/3287* (2019.01)
*G04G 21/08* (2010.01)

(52) U.S. Cl.
CPC .......... *G06F 1/3231* (2013.01); *G06F 1/3287* (2013.01); *G06F 3/044* (2013.01); *G06F 3/0416* (2013.01); *G06F 3/0418* (2013.01); *G04G 21/08* (2013.01); *H03K 2017/9455* (2013.01); *H03K 2217/94026* (2013.01); *Y02D 10/171* (2018.01); *Y02D 10/173* (2018.01); *Y02D 50/20* (2018.01)

(58) Field of Classification Search
CPC .......... H01Q 1/243; H01Q 1/44; H01Q 1/273; G01R 27/2605; H04M 1/0202; H04M 2250/12; G04G 21/08
See application file for complete search history.

(56) References Cited

U.S. PATENT DOCUMENTS

| | | |
|---|---|---|
| 2013/0182867 A1 | 7/2013 | Knowles |
| 2013/0307822 A1 | 11/2013 | Huang et al. |
| 2014/0059365 A1 | 2/2014 | Heo et al. |
| 2014/0071008 A1* | 3/2014 | Desclos ................ H01Q 1/243 343/745 |
| 2014/0139380 A1* | 5/2014 | Ouyang ................ H01Q 7/00 343/702 |
| 2014/0239982 A1 | 8/2014 | Alameh et al. |
| 2014/0333494 A1* | 11/2014 | Huang ................ H01Q 1/002 343/720 |
| 2016/0061983 A1* | 3/2016 | Heikura ................ H01Q 1/243 324/207.15 |

OTHER PUBLICATIONS

European Search Report dated Jun. 12, 2017 issued in counterpart application No. 16197416.7-1972, 15 pages.

* cited by examiner

ELECTRONIC DEVICE AND METHOD OF DETERMINING TOUCH IN ELECTRONIC DEVICE

PRIORITY

This application claims priority under 35 U.S.C. § 119(a) to Korean Patent Application Serial No. 10-2015-0157750, which was filed in the Korean Intellectual Property Office on Nov. 10, 2015, and Korean Patent Application Serial No. 10-2016-0119429, which was filed in the Korean Intellectual Property Office on Sep. 19, 2016, the entire content of which is incorporated herein by reference.

BACKGROUND

1. Field of the Disclosure

The present disclosure relates generally to determining touch in an electronic device, and more specifically, to an electronic device and a method of determining a touch in the electronic device.

2. Description of the Related Art

Herein, electronic devices refer not only to home appliances, but also devices that perform specific functions according to programs installed therein, such as electronic diaries, portable multimedia players, mobile communication terminals, tablet Personal Computers (PCs), video/audio devices, desktop/laptop computers, navigation systems for vehicles, etc. Electronic devices may output information stored therein, such as sounds or images. Along with the increased integration of electronic devices and wide usage of high-speed and high-capacity wireless communication, recently, multiple various functions have been loaded into individual electronic devices, such as mobile communication terminals.

For example, an entertainment function, such as games, a multimedia function, such as the reproduction of music/video files, a communication and security function for mobile banking, etc., a scheduling function, an electronic wallet function, etc., as well as a communication function, have been integrated into a single electronic device.

For instance, electronic devices may be equipped with various forms of sensors, such as, for example, a capacitive sensor, to provide various types of services using sensed information.

A method of setting threshold capacitance in an electronic device in order to calibrate a capacitive sensor, such as a touch sensor, which performs sensing through a change in capacitance, may increase manufacturing time required for the electronic device, thereby degrading productivity. Further, due to a process operator's mistake, an inaccurate threshold value for calibration of a capacitive sensor may be set in an electronic device.

Further, in a method of recognizing whether a wearable device is worn by a user, Light Emitting Diodes (LEDs) may be turned on in order to raise an accuracy with which an Infrared Ray (IR) sensor recognizes light. Turning the LEDs on/off in the detection process may cause consumption of additional current. Further, when there is a tattoo on the user's skin, a malfunction that prevents blood flow from being measured, may occur.

In designing small electronic devices, such as a wearable device, mounting efficiency of the device may be degraded when a connector or contact terminal for electrically connecting a sensing pad and a touch sensor are added to the design of the device.

SUMMARY

An aspect of the present disclosure is to address at least the above-mentioned problems and/or disadvantages and to provide at least the advantages described below.

An aspect of the present disclosure is to provide an electronic device and a method of determining a touch in the electronic device that can improve a recognition rate for a touch input that is input to a touch sensing pad equipped to the electronic device.

According to an aspect of the present disclosure, an electronic device is provided. The electronic device includes a housing that includes a first surface, a second surface opposite to the first surface, and a side surface that surrounds at least part of a space between the first and second surfaces; a Radio Frequency (RF) communication circuit disposed in the housing; an antenna radiator that forms at least part of at least one of the first surface, the second surface, and the side surface of the housing and is electrically connected to the RF communication circuit; a first conductive member that forms at least a part of the antenna radiator, or is disposed to be spaced apart from the antenna radiator; a switching circuit disposed in the housing; a sensor electrically connected to the first conductive member through the switching circuit and configured to detect at least one of contact and proximity of an external object to the first conductive member; a processor electrically connected to the RF communication circuit, the switching circuit, and the sensor; and a memory electrically connected to the processor, wherein the memory may store instructions that allow the processor, when being executed, to determine whether at least a part of the electronic device has been activated and to provide a first state in which the sensor and the first conductive member are electrically separated from each other when at least a part of the electronic device is deactivated and a second state in which the sensor and the first conductive member are electrically connected to each other when at least a part of the electronic device is activated, by using the switching circuit.

According to another aspect of the present disclosure, an electronic device is provided. The electronic device includes a housing that includes a first surface, a second surface opposite to the first surface, and a side surface that surrounds at least part of a space between the first and second surfaces; a Radio Frequency (RF) communication circuit disposed in the housing; an antenna radiator that forms at least part of at least one of the first surface, the second surface, and the side surface of the housing and is electrically connected to the RF communication circuit; a sensor configured to detect whether an external object is in contact or near contact with the antenna radiator; a switching circuit that includes a first terminal electrically connected to the antenna radiator and a second terminal electrically connected to the sensor; a processor electrically connected to the sensor and the switching circuit; and a memory electrically connected to the processor, wherein the memory may store instructions that allow the processor, when being executed, to receive a first measurement value from the sensor when the antenna radiator and the sensor are electrically connected to each other through the switching circuit and to receive a second measurement value from the sensor when the antenna radiator and the sensor are electrically separated from each other by the switching circuit.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
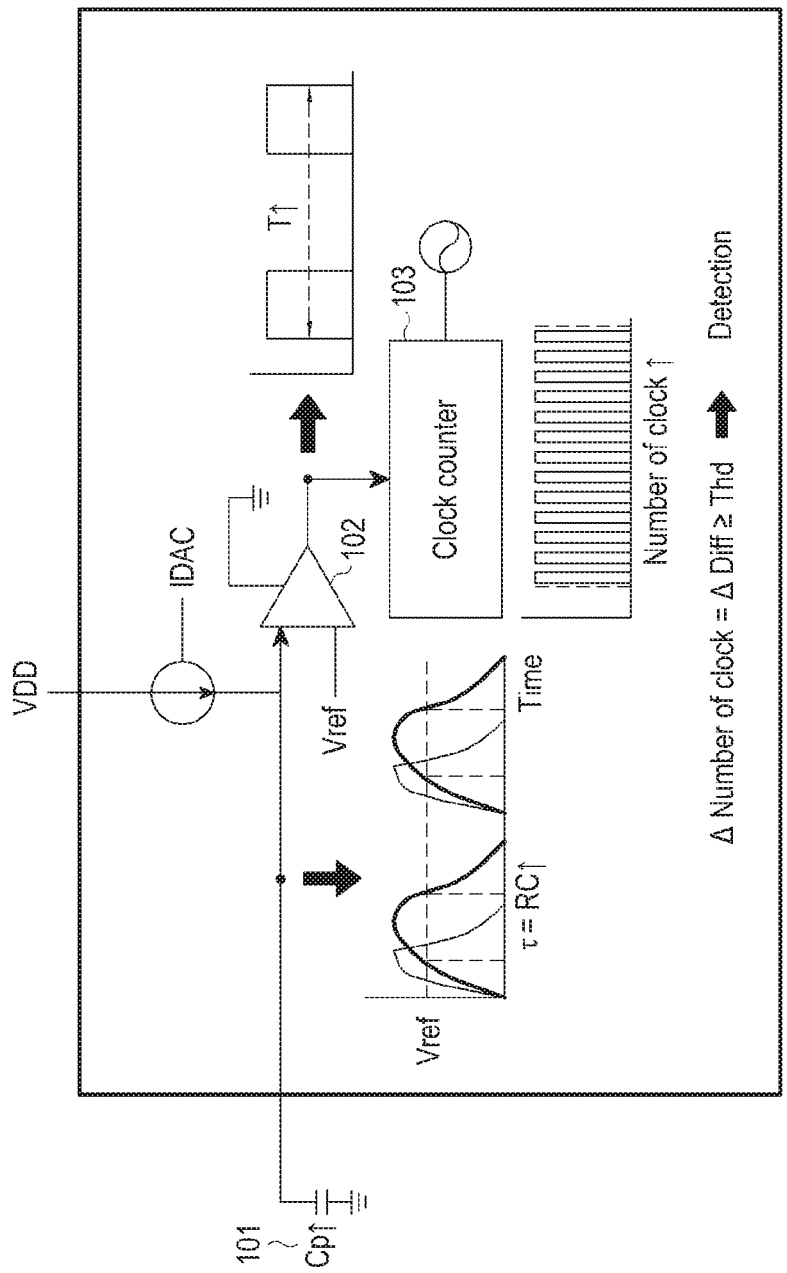
FIG. 1 is a diagram illustrating a touch detection method according to a prior art of the present disclosure.

Various embodiments of the present disclosure will now be described in detail with reference to the accompanying drawings. In the following description, specific details such as detailed configuration and components are merely provided to assist the overall understanding of these embodiments of the present disclosure. Therefore, it should be apparent to those skilled in the art that various changes and modifications of the embodiments described herein can be made without departing from the scope and spirit of the present disclosure. In addition, descriptions of well-known functions and constructions are omitted for clarity and conciseness. In the drawings, the same or similar reference numerals may be used to designate the same or similar constituent elements.

Terms as used herein are merely used for the purpose of explaining some embodiments of the present disclosure and are not intended to limit the present disclosure to the embodiments.

Herein, expressions such as "have", "may have", "include" or "may include" refer to the existence of a corresponding feature (e.g., numerical value, function, operation, or components such as elements), but do not exclude the existence of additional features.

Herein, the expressions "A or B", "at least one of A or/and B", and "one or more of A or/and B" may refer to all possible combinations of the items listed. For example, the expressions "A or B", "at least one of A and B", and "at least one of A or B" may refer to (1) at least one A, (2) at least one B, or (3) both at least one A and at least one B.

The expressions "a first", "a second", "the first", and "the second" used herein may modify various components, regardless of the order and/or the importance of the components, but do not limit the corresponding components. The above expressions merely distinguish an element from other elements. For example, a first user device and a second user device indicate different user devices, although both are user devices. For example, a first element may be referred to as a second element, and similarly, a second element may be referred to as a first element without departing from the scope of the present disclosure.

When an element (e.g., first element) is referred to as being (operatively or communicatively) connected or coupled to another element (e.g., a second element), the first element may be directly connected or coupled directly to the second element or any other element (e.g., a third element) may be interposed between them. By contrast, when an element (e.g., a first element) is referred to as being directly connected or directly coupled to another element (e.g., a second element), there are no elements (e.g., a third element) interposed between them.

As used herein, the expression "configured to" may be interchangeably used with the expressions "suitable for", "having the capability to", "designed to", "adapted to", "made to", and "capable of". The term "configured to" does not necessarily imply "specifically designed to" with respect to hardware. Alternatively, in some situations, the expression "device configured to" may indicate that the device, together with other devices or components, "is able to" to perform a corresponding operation. For example, the phrase "processor adapted (or configured) to perform A, B, and C" may indicate a processor (e.g., an embedded processor) dedicated only to performing the corresponding operations or a generic-purpose processor (e.g., a Central Processing Unit (CPU) or an Application Processor (AP)) that can perform the corresponding operations, by executing one or more software programs stored in a memory device.

Herein, singular forms may include plural forms as well unless the context clearly indicates otherwise. Unless defined otherwise, all terms used herein, including technical terms and scientific terms, may have the same definition as commonly understood by a person of ordinary skill in the art to which the present disclosure pertains. Terms defined in a generally used dictionary may be interpreted to have the same definitions as the contextual definition in the relevant field of art, and are not to be interpreted to have ideal or excessively formal definitions, unless clearly defined in the present disclosure. In some cases, even the terms defined herein are not to be construed to exclude embodiments of the present disclosure.

An electronic device according to an embodiment of the present disclosure, for example, may include at least one of a smartphone, a tablet PC, a mobile phone, a video phone, an electronic book (e-book) reader, a desktop PC, a laptop PC, a netbook computer, a workstation, a server, a Personal Digital Assistant (PDA), a Portable Multimedia Player (PMP), a Motion Picture Experts Group (MPEG) Audio Layer 3 (MP3) player, a mobile medical appliance, a camera, and a wearable device (e.g., smart glasses, a Head-Mounted-Device (MID), electronic clothes, an electronic bracelet, an electronic necklace, an electronic appcessory, an electronic tattoo, a smart mirror, or a smart watch).

According to an embodiment of the present disclosure, the electronic device may be a smart home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to an embodiment of the present disclosure, the electronic device may include at least one of, for example, various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a vehicle infotainment device, an electronic device for a ship (e.g., a navigation device for a ship, and a gyro-compass), avionics, security devices, an automotive head unit, a home robot or an industrial robot, an Automatic Teller Machine (ATM) in a bank, a Point of Sales (POS) device in a shop, or an Internet of Things (IoT) device (e.g., a light bulb, various sensors, an electric or gas meter, a sprinkler device, a fire alarm, a thermostat, a streetlamp, a toaster, a sporting goods, a hot water tank, a heater, a boiler, etc.).

According to an embodiment of the present disclosure, the electronic device may include at least one of, for example, at least a part of furniture or a building/structure, an electronic board, an electronic signature receiving device, a projector, and various kinds of measuring instruments (e.g., a water meter, an electric meter, a gas meter, and a radio wave meter). An electronic device according to an embodiment of the present disclosure may be a combination of one or more of the aforementioned devices. An electronic device according to an embodiment of the present disclosure may be a flexible device. Further, electronic devices according to embodiments of the present disclosure are not limited to the aforementioned devices, and may include new electronic devices according to developments in technology.

Methods of determining whether a touch sensor, which is equipped in an electronic device, is touched according to embodiments of the present disclosure are described herein below. Herein, a 'touch' may include an external object accessing a sensing pad, such as via hovering, etc., as well as direct contact of the external object with the sensing pad, such as a touch pad, etc. Further, a touch sensor that determines a touch through a sensing pad when a person holds the sensing pad with his/her hand may also include the function of a grip sensor.

For example, a sensing pad may include a conductive member, and a change in capacitance measured through the sensing pad may be determined as an external object capable of causing a change in capacitance of the sensing pad makes contact with the sensing pad, or approaches the sensing pad, thereby determining whether the external object touches the sensing pad.

Herein, a touch sensor that determines the touch or access of the external object by determining the change in the capacitance measured through the sensing pad is referred to as a 'capacitive sensor,' a 'capacitive touch sensor,' or a 'capacitive proximity sensor.' However, a touch sensor is not limited to these terms, and any type of sensor capable of performing the same or a similar function may be referred to as a capacitive sensor, in accordance with embodiments of the present disclosure.

A sensor circuit and device structure for solving a setting error of a threshold value, which is generated in the process of calibrating a capacitive sensor, and a touch detection error, which is caused by a parasitic capacitance deviation of a sensing pad, are disclosed herein. Further, a low-power sensor circuit and device structure for an improvement in detecting whether a wearable device is worn is disclosed in the various embodiments of the present disclosure.

Methods of determining a presence or absence of a touch through a capacitive sensor or a touch sensor are described herein with reference to FIGS. 1 to 4.

An electronic device, according to an embodiment of the present disclosure, may include a sensing pad (e.g., a touch pad) that receives a contact or proximity input from an external object or a human body, a switching circuit (e.g., at least one transistor) that electrically connects the touch pad and a touch sensor circuit (e.g., a capacitive sensor circuit), a touch sensor (e.g., capacitive sensor) that determines a presence or absence of a touch by detecting a change in capacitance of the touch pad, etc.

The sensing pad may include a main sensing pad and at least one sub-sensing pad (e.g., a first, a second and a third conductive members) that is separated from the main sending pad by a preset distance. The main sensing pad may be connected to a single sensing channel of the capacitive sensor, and the at least one sub-sensing pad may be separated from the main sensing pad in consideration of an area therebetween, a coupling coefficient, etc, instead of being directly connected to the sensing channel, which enables detection of a change in capacitance at various locations.

The switching circuit may be controlled in order to set a threshold capacitance value; a capacitance value that is detected through the capacitive sensor while the sensing pad and the capacitive sensor are electrically disconnected from each other may be set to a first threshold value; and a change in capacitance that is generated while the electronic device is deactivated may also be recognized after the electronic device is changed from the deactivated state to an activated state.

Further, according to an embodiment of the present disclosure, a capacitance value detected while the sensing pad and the capacitive sensor are electrically connected to each other may be set to a second threshold value, and the change in capacitance generated while the electronic device is deactivated may be recognized.

A grip sensor or a touch sensor according to an embodiment of the present disclosure may be included in the above-described capacitive sensor, and the capacitive sensor may detect a change in capacitance generated when a conductive object (e.g., a user's hand, human body, electronic pen, etc.) closely approaches or makes contact with the sensing pad.

The capacitive sensor may be classified into a capacitive sensor that detects resistance and a capacitive sensor that detects capacitance, and according to an embodiment of the present disclosure, a capacitive sensor that detects capacitance may be used to detect various states in which a user wears a watch-type wearable device.

According to an embodiment of the present disclosure, a detection method using measurement of self-capacitance may be used as a method of detecting capacitance. However, embodiments of the present disclosure are not limited thereto, and a method of measuring mutual capacitance may also be used.

For example, a self-capacitance measuring method according to an embodiment of the present disclosure can simplify a structure of an electronic device and may be applied to micro-sensor circuit design, by measuring parasitic capacitance for a human body's contact on a single plane.

FIG. 1 is a diagram illustrating a touch detection method according to an embodiment of the present disclosure.

Referring to FIG. 1, a capacitive sensor (e.g., a touch sensor) may input a periodic pulse voltage signal through a detection channel connected to a sensing pad, and a delayed pulse waveform may be generated by an increase in a parasitic capacitance (Cp) 101 when a human body makes contact with the sensing pad, and a clock counter 103 may count a number of clocks, which are increased during the delayed time period, from an output value of a comparator 102 to detect a change in capacitance, thereby determining whether a human body or another external object makes contact with, or closely approaches, the sensing pad.

For example, a mutual capacitance method of performing input detection requires two electrodes that are connected to a receiver (RX) channel and a transceiver (TX) channel, and has an advantage over other methods in that coordinates are detected by using a plurality of X and Y channels, and a multi-touch input can be recognized.

When a threshold value has to be set in order to calibrate the capacitive sensor (e.g., a touch sensor or a grip sensor), a threshold capacitance is set through a calibration process while manufacturing an electronic device.

When an external conductive object makes contact with the sensing pad while the electronic device is deactivated, it is difficult to detect the external object, because there is no change in capacitance, even though the electronic device is changed into an activated state. Accordingly, in the manufacturing process, a threshold value is set by differentiating a state in which a conductive object makes contact with a sensing pad and a state in which a conductive object does not make contact with the sensing pad.

For example, in the manufacturing process, a value '155000(155 pF)' measured while a conductive object does not make contact with the sensing pad may be stored as a first threshold value, and a value '158000(158 pF)' measured while a conductive object makes contact with the sensing pad may be stored as a second threshold value. A threshold interval that has the first threshold value as the lower limit and the second threshold value as the upper limit may be set (e.g., 155000<value<158000).

Figure 2:
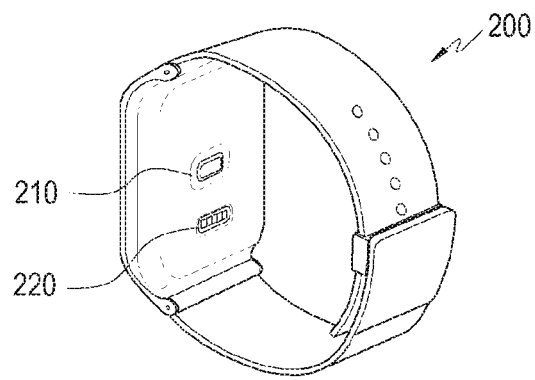
FIG. 2 is a diagram illustrating a wearable device equipped with various types of sensors, according to a prior art of the present disclosure.
Figure 3:
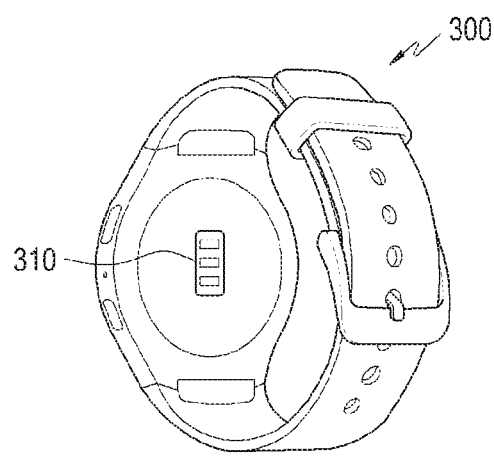
FIG. 3 is a diagram illustrating a wearable device equipped with various types of sensors, according to a prior art of the present disclosure.

As illustrated in FIG. 2, sensors 210 and 220 are provided on an underside of a watch 200 in order to recognize whether the watch-type wearable device is worn on a human body. Further, as illustrated in FIG. 3, Heart Rate Monitor (HRM) sensors 310, which include InfraRed (IR) sensors and LEDs, are provided on an underside surface of a watch 300. The HRM sensors 310 can measure heartbeats, and a result of the measurements can be used to determine whether the watch 300 is worn on a human body. Colored LEDs (e.g., green or red LEDs) may be used to accurately measure blood flow. The colored blood flow (e.g., a heartbeat) may be measured by periodically receiving a signal through the IR sensors.

Figure 4:
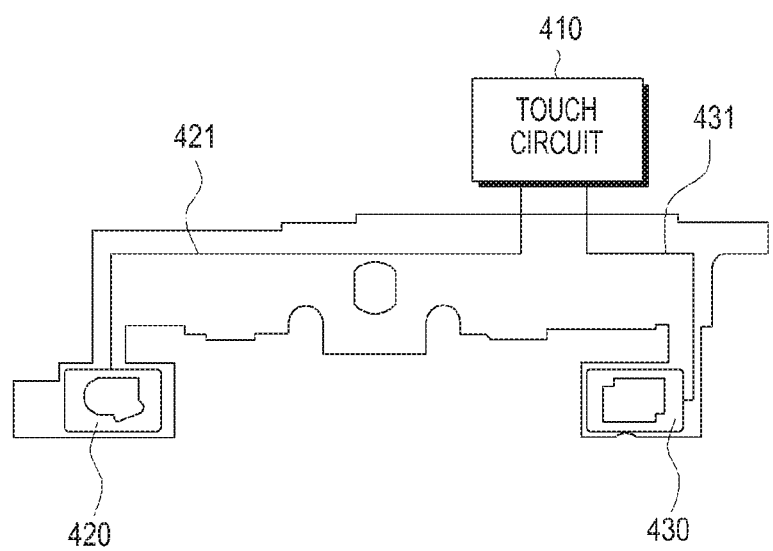
FIG. 4 is a diagram illustrating a touch key using a touch sensor, according to a prior art of the present disclosure.

Referring to FIG. 4, a plurality of sensing pads 420 and 430 and sensing channels 421, 431 that connect the sending pads 420 and 430, respectively, and a capacitive sensor (e.g., a touch circuit 410) are used to recognize a plurality of touch points by using a self-capacitance type of touch sensor.

Using an independent pad and a corresponding sensing channel, each sensing pad may recognize a point where a touch input is generated. For example, as illustrated in FIG. 4, the sensing pad 420, which corresponds to a menu key, and the sensing pad 430, which corresponds to a back key, are connected to the capacitive sensor (i.e., the touch circuit 410) through the separate sensing channels 421 and 431, respectively, so that touch inputs can be distinguished from each other.

Circuit components, such as capacitors, diodes, etc., which are configured in a sensor circuit of an electronic device, have capacitance deviations of about ±10%, which may cause deviations of first and second threshold values that are set between a plurality of pieces of user equipment.

Table 1 below shows three example sets of first threshold values and second threshold values A, B, and C, according to whether a conductive object is contacted.

TABLE 1

|  | SET A | SET B | SET C |
|---|---|---|---|
| First threshold value (without conductor) | 155000 | 159000 | 152000 |
| Second threshold value (with conductor) | 158000 | 162000 | 155000 |
| If, Power On Grip Value = 157000 | Detectable | Undetectable (Always In Contact) | Undetectable (Always Out of Contact) |

For example, assuming that a Power On Grip value of 157000 (nF) is monotonously measured for the plurality of sets as listed in Table 1 above, in the example of set B, the Power On Grip value is less than the set threshold value interval so that a conductive object may be recognized as always being in contact with a sensor, and in the example of set C, the Power On Grip value is greater than the set threshold value interval, so that a conductive object may be recognized as always not being in contact with the sensor, which causes a malfunction in a touch sensor.

Further, a method of recognizing whether a wearable device is worn, by using an HRM sensor, requires turning on an LED in order to increase light recognition accuracy of an IR sensor. Due to the operation of turning the LED on/off, additional current consumption may occur in the detection process. Further, blood flow cannot be measured from skin on which there is a tattoo. Table 2 below shows current consumption per a unit time of three types of detection sensors that may be used in a wearable device.

TABLE 2

|  | HRM sensor | Mutual-Capacitance sensor | Self-Capacitance sensor |
|---|---|---|---|
| Current consumption | 1.6 mA | 2.7 mA | 0.1 mA |

A multi-channel self-capacitance touch sensor may be effective in detecting a plurality of touch points. In the multi-channel self-capacitance touch sensor, a sensing pad is located at a desired touch recognition point, and an independent sensing channel is connected to the touch sensor.

In a micro device, such as a watch-type wearable device, mounting efficiency may degrade due to the addition of a connection circuit or connection terminal for an electrical connection between a sensing pad and a touch sensor.

According to embodiments of the present disclosure, it is possible to improve a recognition rate for a touch input to a touch sensing pad when a self-capacitance type of touch sensor is in a deactivated state. Further, an embodiment of the present disclosure provides a low-power sensor circuit and device structure for improving detection of whether a wearable device is worn.

In addition, according to embodiments of the present disclosure, it is possible to improve component mounting efficiency through a structure in which a single channel or a plurality of touch sensing pads are used for the design of the micro wearable device.

Hereinafter, detailed configurations of electronic devices, according to embodiments of the present disclosure, are described with reference to FIGS. 5 to 9.

Figure 5:
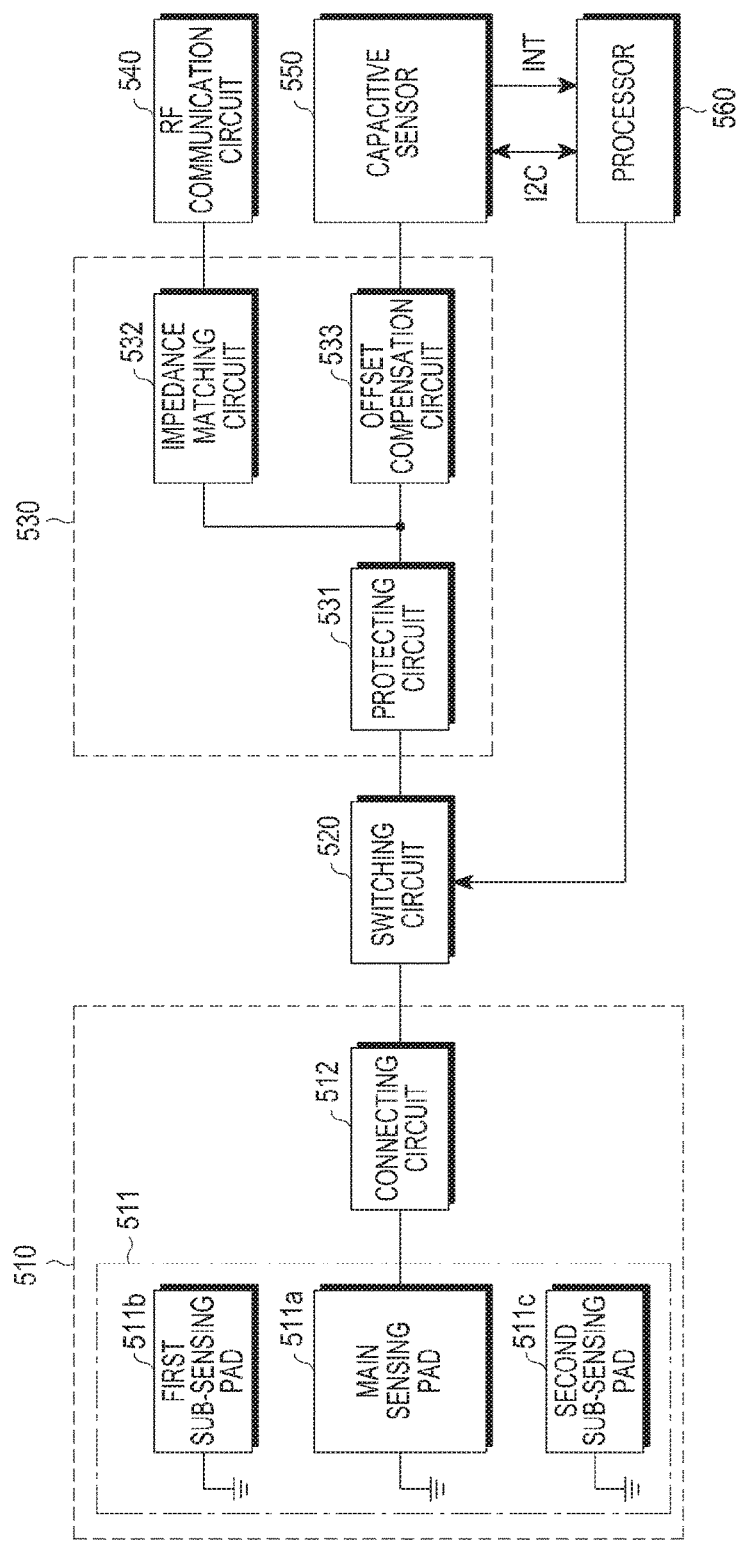
FIG. 5 is a block diagram illustrating a configuration example of an electronic device according to an embodiment of the present disclosure.

FIG. 5 is a block diagram illustrating a configuration example of an electronic device according to an embodiment of the present disclosure.

Referring to FIG. 5, an electronic device includes a sensing pad unit 511 (which includes a main sensing pad 511a, a first sub-sensing pad 511b, and a second sub-sensing pad 511c), a connecting circuit 512, a switching circuit 520, a protecting circuit 531, an impedance matching circuit 532, an offset compensations circuit 533, an RF communication circuit 540, a capacitive sensor 550, and a processor 560.

The main sensing pad 511a is directly connected to the connecting circuit 512 and the first and second sub-sensing pads 511b and 511c, which are spaced apart from the main sensing pad 511a by a preset space. The sensing pad unit 511 and the connecting circuit 512 form external capacitance 510. Further, the protecting circuit 531, the impedance matching circuit 532, and the offset compensation circuit 533 may form internal capacitance 530.

According to an embodiment of the present disclosure, the connecting circuit 512 included in the external capacitance 510 and the protecting circuit 531 included in the internal capacitance 530 are connected/disconnected from each other by the switching circuit 520. For example, the switching circuit 520 is turned on/off according to a control signal of the processor 560.

The sensing pads 511a, 511b, and 511c of the sensing pad unit 511 may be formed of a conductive material. The sensing pads 511a, 511b, and 511c may be configured in a plate or line form and may form measurable capacitance. Further, as described above, the main sensing pad 511a of the sensing pad unit 511 may be directly connected to the connecting circuit 512 through a single channel, and the first and second sub-sensing pads 511b and 511c may be disposed to be spaced apart from the main sensing pad 511a by a preset space (e.g., a distance by which coupling capacitance may be formed).

According to an embodiment of the present disclosure, at least one of the main sensing pad 511a, the first sub-sensing pad 511b, and the second sub-sensing pad 511c may be configured to perform a function of an antenna (e.g., an antenna radiator). Further, an antenna equipped to the electronic device may also be used as a sensing pad. For example, a metal antenna of the electronic device that is exposed to an outside of the electronic device, or is provided adjacent to an outside of the electronic device, may also perform the function of a sensing pad.

According to an embodiment of the present disclosure, the sensing pads 511a, 511b, and 511c of the sensing pad unit 511 may be disposed in the shape of a Flexible Printed Circuit Board (FPCB) in the interior of the electronic device (e.g., wearable device), and may also be commonly designed in the shape of a FPCB along with a wireless charging coil.

The connecting circuit 512 may connect the main sensing pad 511a and a sensor circuit (e.g., a circuit board that includes various types of circuits) through a contact terminal. The connecting circuit 512 may be configured in a resilient structure (e.g., a C-clip), or may be electrically connected by a solder or connector, without being limited to a specific material or shape.

The switching circuit 520 may include one switching element that switches on/off the connection between the connecting circuit 512 and the protecting circuit 531 by the processor 560. According to an embodiment of the present disclosure, the switching circuit 520 may be controlled to an OFF state when the electronic device is in a deactivated state, and may be controlled to an ON state when the electronic device is in an activated state.

As illustrated in FIG. 5, the external capacitance 510 and the internal capacitance 530 may be distinguished from each other based on the switching circuit 520. For example, a difference in capacitance may be artificially generated by controlling the switching circuit 520 by the processor 560.

The protecting circuit 531 may include at least one of a series capacitor for a Direct Current (DC) block, a varistor, and a diode. The protecting circuit 531 may provide a function of preventing an electric shock in cases where the main sensing pad 511a is also used as a metal antenna according to an embodiment of the present disclosure. Further, the protecting circuit 531 may provide a function of preventing damage to a component due to static electricity.

As illustrated in FIG. 5, the capacitive sensor 550 is connected to the protecting circuit 531 through the offset compensation circuit 533. Further, the impedance matching circuit 532 that is connected to the RF communication circuit 540 is connected to the protecting circuit 531 in parallel with the offset compensation circuit 533.

The impedance matching circuit 532 may provide impedance matching for an RF transmission line in cases where the main sensing pad 511a is used as an antenna. For example, the impedance matching circuit 532 may include at least one of a resistor, a coil, and a capacitor.

The offset compensation circuit 533 may compensate for capacitance in order to prevent the entire capacitance of a sensing line from exceeding the allowable range of the capacitive sensor 550. The offset compensation circuit 533 may include at least one capacitor.

The RF communication circuit 540 may wirelessly process a signal received from the main sensing pad 511a in cases where the main sensing pad 511a is used as a metal antenna.

The capacitive sensor 550 may detect a change in capacitance to determine a touch, proximity, hovering, grip, or the like by an external object as described above. The capacitive sensor 550 may detect an external object based on at least one threshold value by which calibration has been performed according to an embodiment of the present disclosure.

The processor 560 may analyze data received from the capacitive sensor 550 and may perform a relevant operation according to an embodiment of the present disclosure. Further, the processor 560 may control turning the connection between the connecting circuit 512 and the protecting circuit 531 on/off via the switching circuit 520. An operation of the processor 560 is described herein below.

When an external object makes contact with the sensing pad unit 510 while the electronic device is deactivated, it may be difficult to determine whether the external object makes contact with the sensing pad unit, because there is no change in capacitance caused by the external object even if the electronic device is subsequently activated.

According to an embodiment of the present disclosure, when the electronic device is deactivated, the processor 560 may control the switching circuit 520 to an OFF state and may activate the capacitive sensor 550 in order to sense the internal capacitance 530 other than the external capacitance 510.

The sensed internal capacitance 530 may be stored as an offset value when a determination is made as to whether the capacitive sensor 550 is touched, and may be used to compensate for a deviation of measured values that is caused by a capacitance deviation of an internal circuit component, etc.

Further, according to an embodiment of the present disclosure, the processor 560 may control the switching circuit 520 to an ON state when the electronic device is activated, and may control the switching circuit 520 such that the internal capacitance 530 or the external capacitance 510 is reflected in capacitance sensed by the capacitive sensor 550.

The capacitive sensor 550 may be implemented as a touch sensor of a self-capacitance type according to an embodiment of the present disclosure, and may measure the capacitance of the sensing pad unit 511 or the external capacitance 510 when the switching circuit 520 is in a turned-on state according to the control of the switching circuit 520 by the processor 560.

Further, according to an embodiment of the present disclosure, when the switching circuit 520 is in an OFF state, the capacitive sensor 550 may be electrically disconnected from the sensing pad unit 511 and may measure the internal capacitance 530 that is generated by a circuit component, a strip-line in a PCB, etc.

Hereinafter, various modified examples of the circuit illustrated in FIG. 5 are described with reference to FIGS. 6 to 9. For example, in the following examples, external capacitance or internal capacitance may be diversely configured through the addition, deletion, location change, etc. of an element in a circuit. In a manner similar to the circuit of FIG. 5, an error in internal capacitance can be reflected in the determination of a touch by controlling a switching circuit by a processor in the following embodiments.

For example, a device that has parasitic capacitance may be additionally disposed between a connecting circuit and a switching circuit, or the design of strip lines may be minimized therebetween. Further, according to embodiments of the present disclosure, a device that has parasitic capacitance may be disposed after a switching circuit, or the design of strip lines may be maximized.

Figure 6:
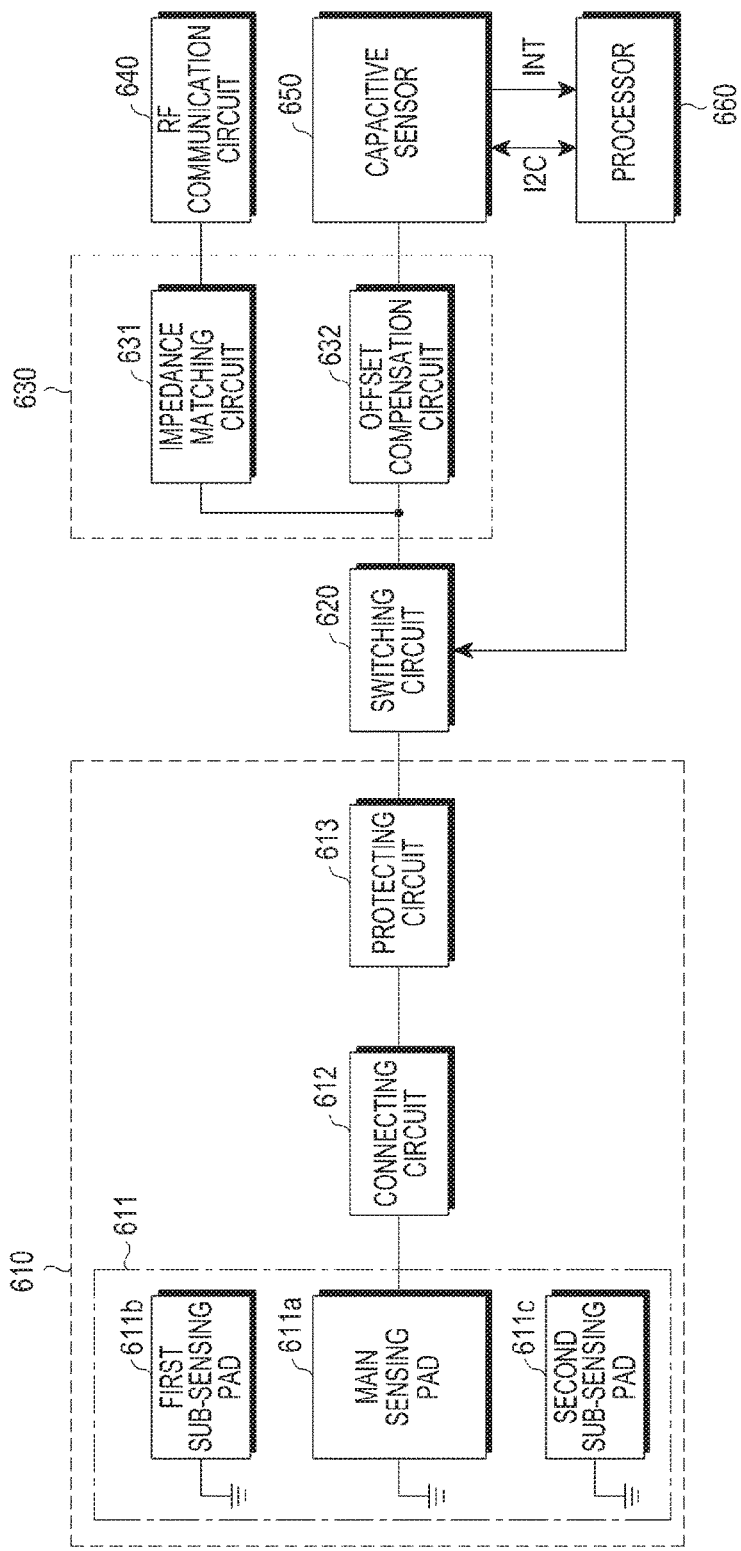
FIG. 6 is a block diagram illustrating a configuration example of an electronic device according to an embodiment of the present disclosure.

FIG. 6 is a block diagram illustrating a configuration example of an electronic device according to an embodiment of the present disclosure.

Referring to FIG. 6, an electronic device includes a sensing pad unit 611 (which includes a main sensing pad 611a, a first sub-sensing pad 611b, and a second sub-sensing pad 611c), a connecting circuit 612, a protecting circuit 613, a switching circuit 620, an impedance matching circuit 631, an offset compensation circuit 632, an RF communication circuit 640, a capacitive sensor 650, and a processor 660.

The main sensing pad 611a is directly connected to the connecting circuit 612 and first and second sub-sensing pads 611b and 611c, which are spaced apart from the main sensing pad 611a by a preset space. The sensing pad unit 611, the connecting circuit 612, and the protecting circuit 613 form external capacitance 610. The impedance matching circuit 631 and the protecting circuit 632 may form internal capacitance 630.

According to an embodiment of the present disclosure, the protecting circuit 613 included in the external capacitance 610 and the offset compensation circuit 632 included in the internal capacitance 630 may be connected or disconnected by the switching circuit 620. For example, the switching circuit 620 may be turned on/off according to a control signal of the processor 660.

Descriptions of elements of FIG. 6 that perform the same or similar functions to the above-described elements of FIG. 5 are omitted herein.

Referring to FIG. 6, the protecting circuit 613 is disposed at the front end of the switching circuit 620 so as to be included in the external capacitance 610, so that the main sensing pad 611a can prevent an electrical shock when functioning as a metal antenna. The parasitic capacitance of the protecting circuit 613 may be reflected in the external capacitance 610, as illustrated in FIG. 6.

Figure 7:
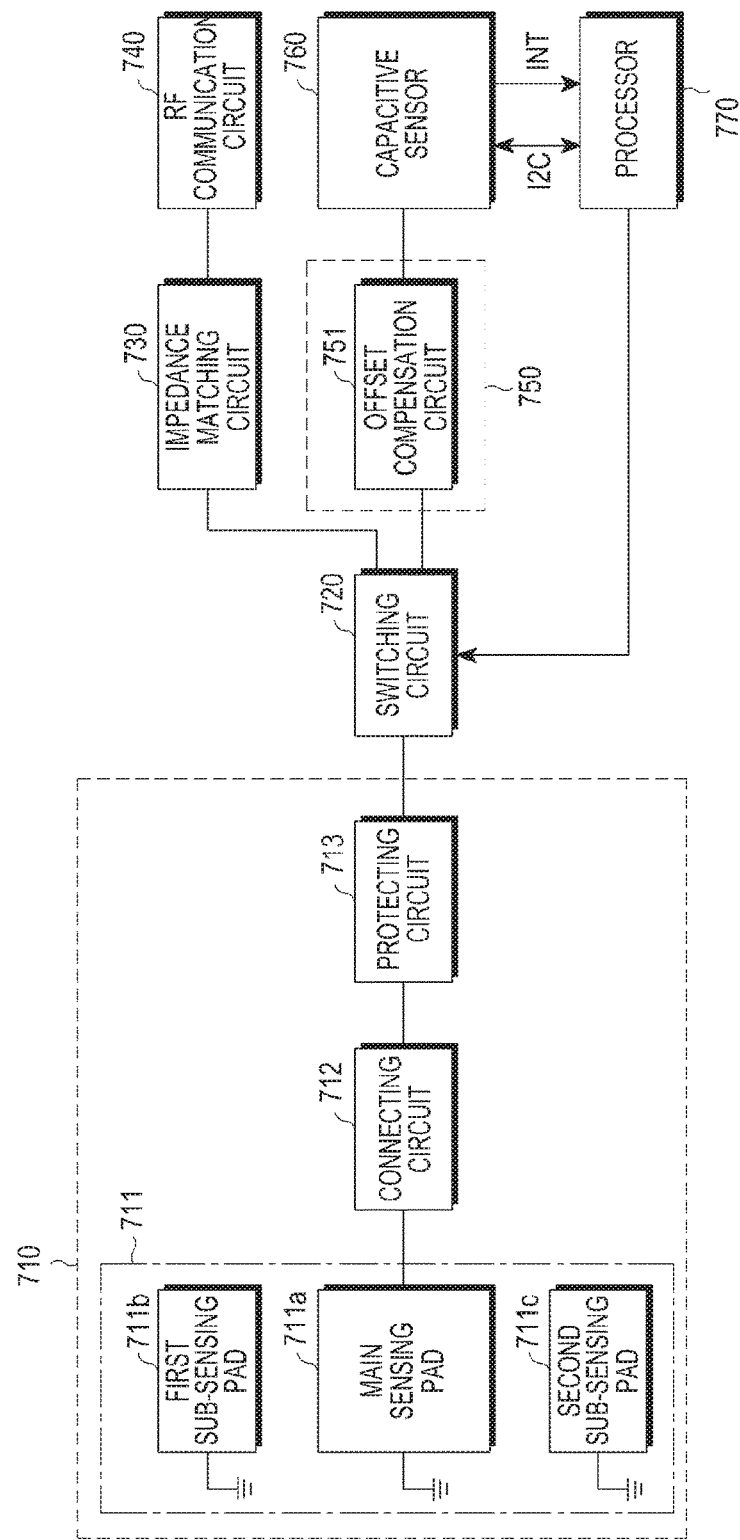
FIG. 7 is a block diagram illustrating a configuration example of an electronic device according to an embodiment of the present disclosure.

FIG. 7 is a block diagram illustrating a configuration example of an electronic device according to an embodiment of the present disclosure.

Referring to FIG. 7, the electronic device includes a sensing pad unit 711 (which includes a main sensing pad 711a, a first sub-sensing pad 711b, and a second sub-sending pad 711c), a connecting circuit 712, a protecting circuit 713, a switching circuit 720, an impedance matching circuit 730, an RF communication circuit 740, an offset compensation circuit 751, a capacitive sensor 760, and a processor 770.

The main sensing pad 711a that is directly connected to the connecting circuit 712, and the first and second sub-sensing pads 711b and 711c are spaced apart from the main sensing pad 711a by a preset space. The sensing pad unit 711, the connecting circuit 712, and the protecting circuit 713 form external capacitance 710. Further, the offset compensation circuit 751 forms internal capacitance 750.

According to an embodiment of the present disclosure, the protecting circuit 710 that is included in the external capacitance 710 and the offset compensation circuit 751 that is included in the internal capacitance 750 or the impedance matching circuit 730 may be connected/disconnected from each other by the switching circuit 720. For example, according to a control signal of the processor 770, the switching circuit 720 may perform a switching operation such that the protecting circuit 713 is connected to the offset compensation circuit 751 or the impedance matching circuit 730.

Further descriptions of the elements of FIG. 7 that perform the same or similar functions as corresponding above-described elements of FIG. 5 or 6 are omitted herein for clarity and conciseness.

Referring to FIG. 7, the protecting circuit 713 may be disposed at the front end of the switching circuit 720 so as to be included in the external capacitance 710 as in FIG. 6 so that the main sensing pad 711a can prevent an electrical shock when functioning as a metal antenna. The parasitic capacitance of the protecting circuit 713 may be reflected in the external capacitance 710 as illustrated in FIG. 7.

Further, referring to FIG. 7, according to an embodiment of the present disclosure, the switching circuit 720 separates a path to the RF communication circuit 740 from a path directed toward the capacitive sensor 760. For example, when the main sensing pad 711a functions as a sensor, the processor 770 may control the switching circuit 720 such that the protecting circuit 713 is connected to the offset compensation circuit 751. In addition, when the main sensing pad 711a functions as a metal antenna, the processor 770 may control the switching circuit 720 such that the protecting circuit 713 is connected to the impedance matching circuit 730. When the circuit is configured as illustrated in FIG. 7, the number of parasitic capacitance devices that constitute the internal capacitance 750 can be reduced.

Figure 8:
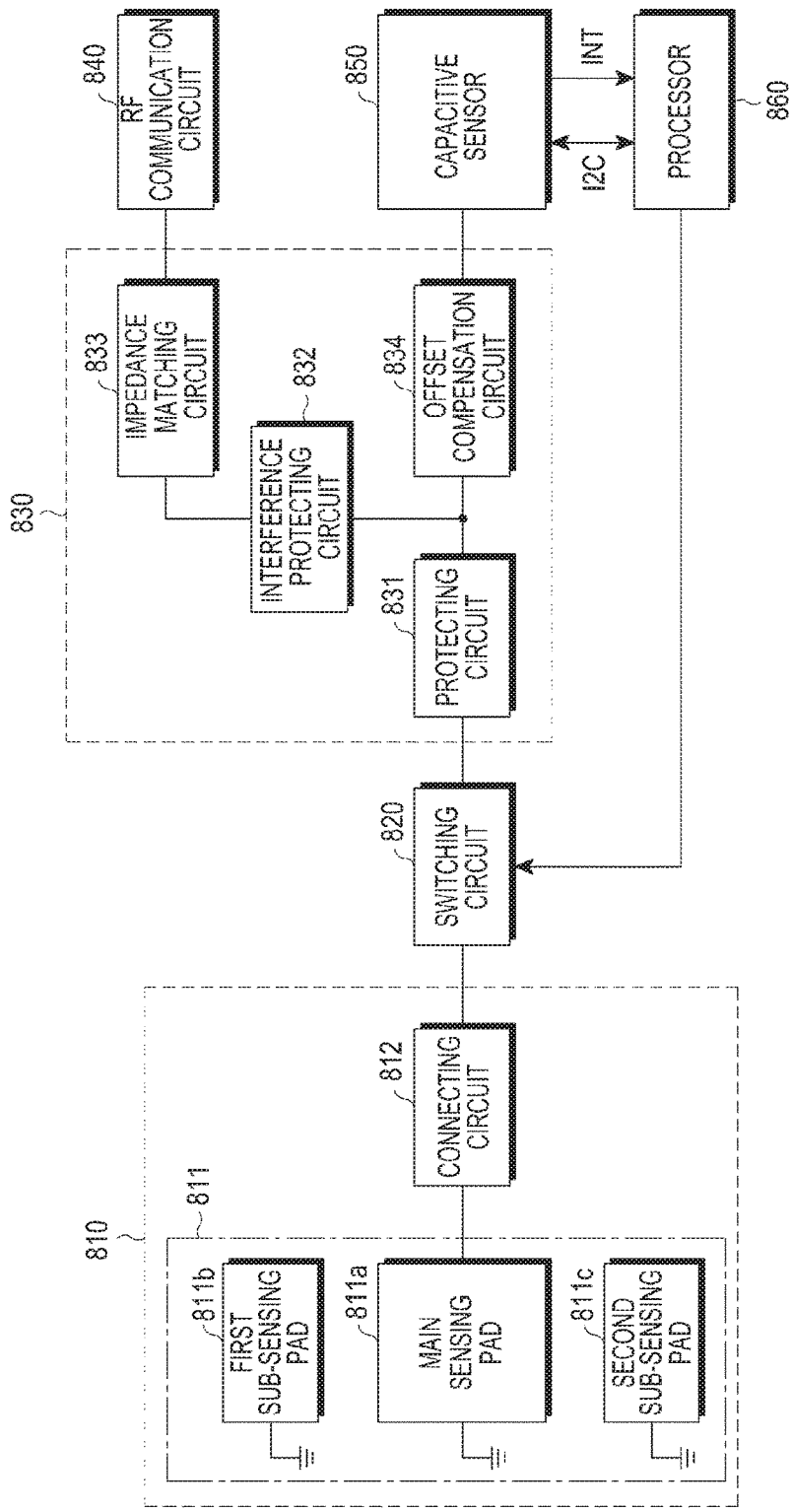
FIG. 8 is a block diagram illustrating a configuration example of an electronic device according to an embodiment of the present disclosure.

FIG. 8 is a block diagram illustrating a configuration example of an electronic device according to an embodiment of the present disclosure. Referring to FIG. 8, an electronic device includes a sensing pad unit 811 (which includes a main sensing pad 811a, a first sub-sensing pad 811b, and a second sub-sending pad 811c), a connecting circuit 812, a switching circuit 820, a protecting circuit 831, an interference protecting circuit 832, an impedance matching circuit 833, an offset compensation circuit 834, an RF communication circuit 840, a capacitive sensor 850, and a processor 860.

The main sensing pad 811a s directly connected to the connecting circuit 812 and the first and second sub-sensing pads 811b and 811c, which are spaced apart from the main sensing pad 811a by a preset space. The sensing pad unit 811 and the connecting circuit 812 form external capacitance 810. The protecting circuit 831, the interference protecting circuit 832, the impedance matching circuit 833, and the offset compensation circuit 834 form internal capacitance 830.

According to an embodiment of the present disclosure, the connecting circuit 812, which is included in the external capacitance 810, and the protecting circuit 831, which is included in the internal capacitance 830, may be connected/disconnected from each other by the switching circuit 820. For example, the switching circuit 820 may be turned on/off according to a control signal of the processor 860.

Descriptions of the elements of FIG. 8 that perform the same or similar functions as corresponding elements of FIG. 5 or 6 are omitted herein for clarity and conciseness.

Referring to FIG. 8, according to an embodiment of the present disclosure, the interference protecting circuit 832 is placed between the protecting circuit 831 and the impedance matching circuit 833, which makes it possible to prevent a noise signal caused by signal interference between an RF circuit and a sensor circuit.

For example, a sensor signal that is introduced into the offset compensation circuit 834 and the capacitive sensor 850 through the switching circuit 820 and the protecting circuit 831 when the main sensing pad 811a functions as a sensor and an RF signal that is introduced into the impedance matching circuit 833 and the RF communication circuit 840 through the switching circuit 820 and the protecting circuit 831 when the main sensing pad 811a functions as an antenna are separated from each other, thereby removing interference therebetween. According to an embodiment of the present disclosure, the interference protecting circuit 832 may be generated by a device that has a characteristic of filtering or blocking a specific frequency band, such as an inductor, a bead, etc.

Figure 9:
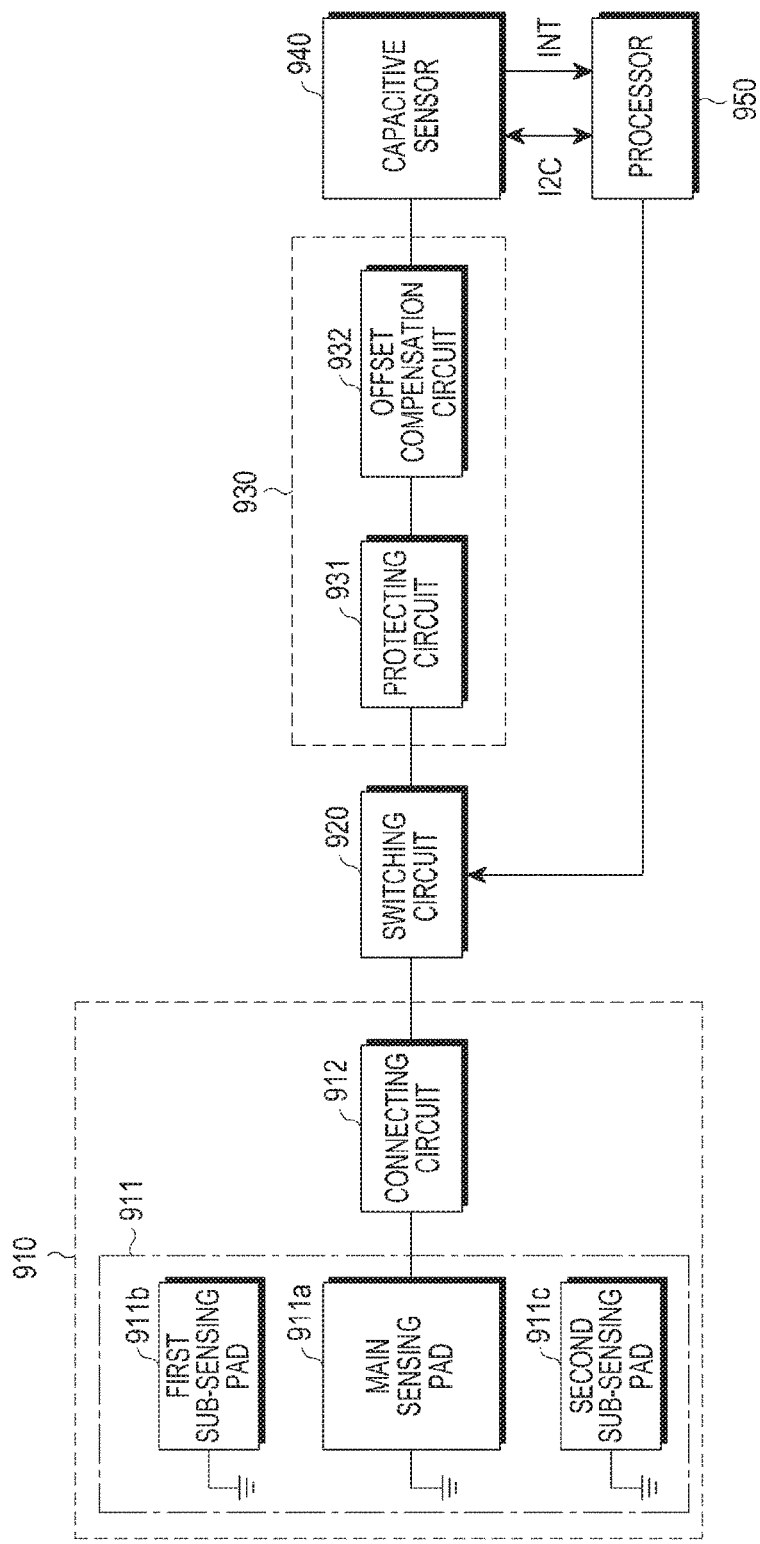
FIG. 9 is a block diagram illustrating a configuration example of an electronic device according to an embodiment of the present disclosure.

FIG. 9 is a block diagram illustrating a configuration example of an electronic device according to an embodiment of the present disclosure.

Referring to FIG. 9, an electronic device includes a sensing pad unit 911 (which includes a main sensing pad 911a, a first sub-sensing pad 911b, and a second sub-sensing pad 911c), a connecting circuit 912, a switching circuit 920, a protecting circuit 931, an offset compensation circuit 932, a capacitive sensor 940, and a processor 950.

The main sensing pad 911a is directly connected to the connecting circuit 912, and the first and second sub-sensing pads 911b and 911c are spaced apart from the main sensing pad 911a by a preset space. The sensing pad unit 911 and the connecting circuit 912 form external capacitance 910. Further, the protecting circuit 931 and the offset compensation circuit 932 form internal capacitance 930.

According to an embodiment of the present disclosure, the connecting circuit 912, which is included in the external capacitance 910, and the protecting circuit 931, which is included in the internal capacitance 930, may be connected/disconnected from each other by the switching circuit 920. For example, the switching circuit 920 may be turned on/off according to a control signal of the processor 950.

Descriptions of the elements of FIG. 9 that perform the same or similar functions as the above-described elements of FIG. 5 or 6 are omitted herein for clarity and conciseness.

Referring to FIG. 9, according to an embodiment of the present disclosure, when the electronic device is implemented in the form of a wearable device, the main sensing pad 911a may merely function as a sensing pad other than an antenna. As described above, when calibration for the capacitive sensor 940 is required, the processor 950 may determine the internal capacitance 930 or the external capacitance 910 by controlling turning on/off the connection between the external capacitance 910 and the internal capacitance 930 via the switching circuit 920, and may determine a threshold value for the determination of a touch based on the determined internal capacitance 930 or external capacitance 910.

Hereinafter, an embodiment of conditions and situations in which the processors 660, 770, 860, and 950 control the switching circuits 620, 720, 820, and 920 in the above-described circuits, respectively, are described in detail with reference to FIG. 10.

Figure 10:
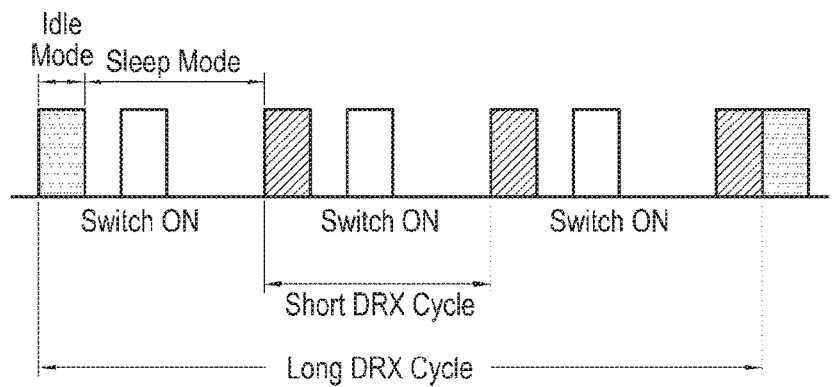
FIG. 10 is a diagram illustrating operation scheduling of a switching circuit according to an embodiment of the present disclosure.

FIG. 10 is a diagram illustrating operation scheduling of a switching circuit according to an embodiment of the present disclosure. Referring to FIG. 10, the trigger of an on/off time point of the switching circuit may change according to whether an RF communication circuit is connected to a sensing pad.

For example, when the RF circuit is connected to the sensing pad, the trigger of an on/off time of the switching circuit may be affected by an idle period between user equipment and a base station. According to an embodiment of the present disclosure, an on/off time point of the switching circuit is in conjunction with an on/off time point of the RF circuit so that the switching circuit may be turned on when the RF circuit is turned off, or when the RF circuit enters a sleep mode. In addition, the switching circuit may be turned off when the RF circuit is turned on again, or when the RF circuit enters an idle mode.

Since current consumption is high when the on/off of the switching circuit is performed according to every idle/sleep period of the RF circuit, the switching circuit may also be turned on/off according to an independent period for a long period time interval.

Further, according to an embodiment of the present disclosure, in the case of a wearable device that is not connected to an RF circuit, an on/off time point of a switching circuit may be in conjunction with an on/off time point of a processor other than an on/off time point of the RF circuit.

Further, according to an embodiment of the present disclosure, the trigger of an on/off time point of the switching circuit may be determined according to whether a screen is turned on/off. For example, the switching circuit may be turned on when the processor is turned on and may be turned off when the processor is turned off, and as described above, internal capacitance may be measured and compensated for.

An example of the above-described operation scheduling according to embodiments of the present disclosure is represented in Tables 3 and 4 below. Table 3 corresponds to an embodiment of the present disclosure in which an RF circuit is provided as illustrated in FIGS. 6 to 8, and Table 4 corresponds to an embodiment of the present disclosure in which an RF circuit is not provided, as illustrated in FIG. 9.

TABLE 3

| Component | with RF circuit | | | |
| --- | --- | --- | --- | --- |
| | RF Circuit | Processor | Sensor | Switch |
| Status #1 (Measure internal capacitance) | ON | ON | ON | OFF |
| Status #2 (Measure external capacitance) | OFF | ON | ON | ON |

TABLE 4

| Component | without RF circuit | | | |
| --- | --- | --- | --- | --- |
| | RF Circuit | Processor | Sensor | Switch |
| Status #1 (Measure internal capacitance) | — | OFF | ON | OFF |
| Status #2 (Measure external capacitance) | — | ON | ON | ON |

Hereinafter, embodiments of the present disclosure in which the elements of the above-described electronic circuit are implemented in an electronic device, a wearable device, etc. are described with reference to FIGS. 11 to 19.

The sensing pad unit or the sensing pads, which have been described above, may be configured in various shapes, and each of the sensing pads may be connected to a ground part of an electronic device.

According to an embodiment of the present disclosure, which is described below, a sensing pad may be configured by using an external housing of an electronic device, or may be configured in the shape of a FPCB in the interior of the electronic device that is adjacent to the external housing of the electronic device. When the sensing pad is configured by using a part of the housing, a plurality of connecting circuits may exist, and the sensing pad may be connected to a ground part through at least one of the plurality of connecting circuits.

Figure 11:
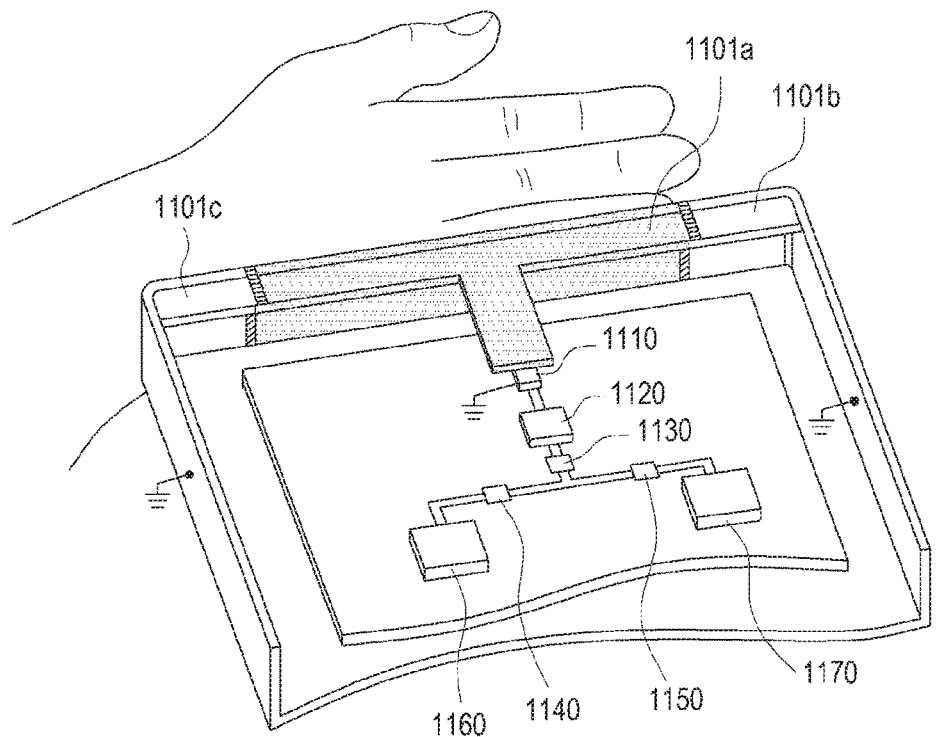
FIG. 11 is a diagram illustrating a component mounting structure of an electronic device according to an embodiment of the present disclosure.

FIG. 11 is a diagram illustrating a component mounting structure of an electronic device according to an embodiment of the present disclosure.

Referring to FIG. 11, a part of the housing of the electronic device includes a metal antenna, and the housing includes a main sensing pad 1101a, a first sub-sensing pad 1101b, and a second sub-sensing pad 1101c. Each of the sub-sensing pads 1101b and 1101c may be spaced apart from the main sensing pad 1101a with a preset space (e.g., a coupling area) therebetween. Further, according to an embodiment of the present disclosure, a dielectric substance may be interposed between the main sensing pad 1101a and each of the sub-sensing pads 1101b and 1101c. The circuit configuration of FIG. 11, which is described herein below, may correspond to the block diagram of FIG. 5.

A connecting circuit 1110, a switching circuit 1120, a protecting circuit 1130, an impedance matching circuit 1140, an offset compensation circuit 1150, an RF communication circuit 1160, and a capacitive sensor 1170 are provided in the interior of the housing. The main sensing pad 1101a is connected to the switching circuit 1120 through the connecting circuit 1110. A connection via the switching circuit 1120 may be turned on/off according to a control signal of a processor. The circuits provided in the housing may be implemented on a PCB.

In FIG. 11, the main sensing pad 1101a, which is included in the metal housing, may be electrically connected to the internal components through the connecting circuit 1110. Further, according to an embodiment of the present disclosure, the sensing pads 1101a, 1101b, and 1101c may be configured in the shape of a FPCB and may be coupled to a PCB by a connecting circuit, such as a solder, a connector, etc.

As described above, one end of the switching circuit 1120 may be directly connected to the main sensing pad 1101a through the connecting circuit 1110, and the other end of the switching circuit 1120 may be connected to the other circuit components.

Figure 12:
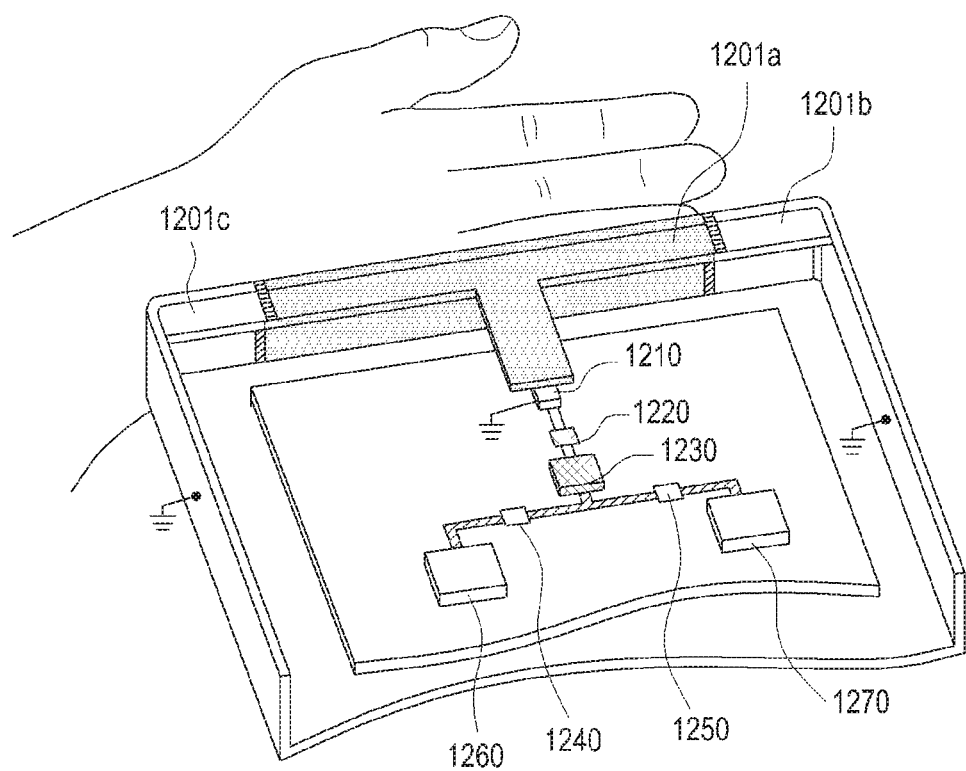
FIG. 12 is a diagram illustrating a component mounting structure of an electronic device according to an embodiment of the present disclosure.

FIG. 12 is a diagram illustrating a component mounting structure of an electronic device according to an embodiment of the present disclosure.

Referring to FIG. 12, a part of the housing of the electronic device includes a metal antenna, and at least a part of the housing includes a main sensing pad 1201a, a first sub-sensing pad 1201b, and a second sub-sensing pad 1201c. Each of the sub-sensing pads 1201b and 1201c may be spaced apart from the main sensing pad 1201a with a preset space (e.g., a coupling area) therebetween. Further, according to an embodiment of the present disclosure, a dielectric substance may be interposed between the main sensing pad 1201a and each of the sub-sensing pads 1201b and 1201c. The circuit configuration of FIG. 12, which are described below, may correspond to the block diagram of FIG. 6.

A connecting circuit 1210, a protecting circuit 1220, a switching circuit 1230, an impedance matching circuit 1240, an offset compensation circuit 1250, an RF communication circuit 1260, and a capacitive sensor 1270 are provided in the interior of the housing. The main sensing pad 1201a is connected to the switching circuit 1230 through the connecting circuit 1210 and the protecting circuit 1220. A connection via switching circuit 1230 may be turned on/off according to a control signal of a processor. The circuits provided in the housing may be implemented on a PCB.

In FIG. 12, the main sensing pad 1201a, which is included in the metal housing, may be electrically connected to the internal components through the connecting circuit 1210. Further, according to an embodiment of the present disclosure, the sensing pads 1101a, 1101b, and 1101c may be configured in the shape of a FPCB and may be coupled to a PCB by a connecting circuit, such as a solder, a connector, etc.

As described above, one end of the switching circuit 1230 may be directly connected to the main sensing pad 1201a through the protecting circuit 1220 and the connecting circuit 1210, and the other end of the switching circuit 1230 may be connected to the other circuit components.

As illustrated in FIG. 12, the protecting circuit 1220 may be disposed on an input end of the switching circuit 1230. When the circuit configuration is implemented as illustrated in FIG. 12, due to parasitic capacitance of a circuit component (e.g., the protecting circuit 1220) that is located between the main sensing pad 1201a and the switching circuit 1230, a deviation of external capacitance measured by the capacitive sensor 1270 must be minimized. In the an embodiment of the present disclosure, internal capacitance caused by a deviation of the capacitance of the circuit components can be reflected in an offset value to the maximum, thereby enhancing the accuracy of the capacitive sensor.

According to embodiments of the present disclosure described herein below, a circuit configuration may be divided into a PCB and an FPCB. For example, a processor and an RF communication circuit may be configured on a PCB, and the remaining circuit configurations may be configured on an FPCB.

Figure 13:
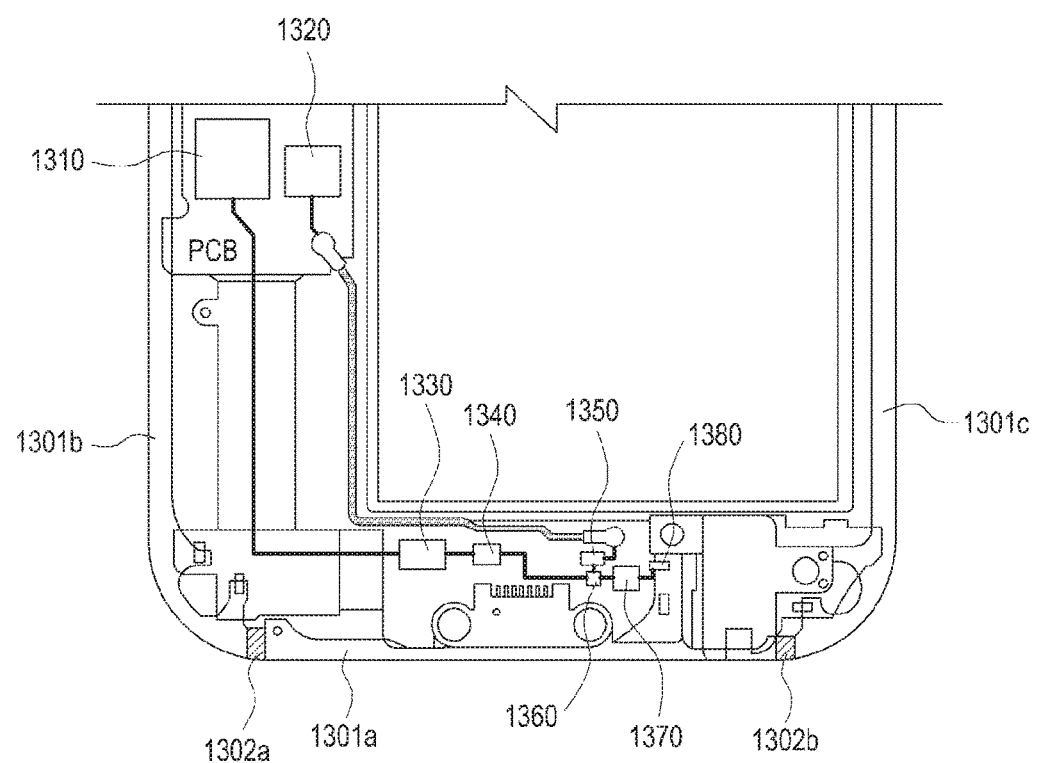
FIG. 13 is a diagram illustrating a component mounting structure of an electronic device according to an embodiment of the present disclosure.

FIG. 13 is a diagram illustrating a component mounting structure of an electronic device according to an embodiment of the present disclosure. Referring to FIG. 13, a main sensing pad 1301a, a first sub-sensing pad 1301b, and a second sub-sensing pad 1301c are included in a housing, and the sensing pads are distinguished from each other by coupling areas 1302a and 1302b therebetween.

The main sensing pad 1301a is connected to a switching circuit 1370 through a connecting circuit 1380 that is configured on an FPCB in the housing. The connecting circuit 1380, the switching circuit 1370, a protecting circuit 1360, an impedance matching circuit 1350, an offset compensation circuit 1340, and a capacitive sensor 1330 may be disposed on the FPCB.

The offset compensation circuit 1340 and the impedance matching circuit 1350 may be connected to the protecting circuit 1360 in parallel. The offset compensation circuit 1340 may be connected to the capacitive sensor 1330, and the capacitive sensor 1330 may be connected to a processor 1310 disposed on a PCB. Further, the FPCB may be electrically connected to a PCB circuit through a connector, and the impedance matching circuit 1350 may be connected to an RF communication circuit 1320, which is disposed on the PCB, through an RF coaxial cable. In FIG. 13, at least one connecting circuit 1380 may be connected to the ground part of the FPCB or PCB in order to generate self-capacitance.

Hereinafter, embodiments of the present disclosure implemented in wearable devices (e.g., watch-type wearable devices) are described with reference to FIGS. 14 to 19.

Figure 14:
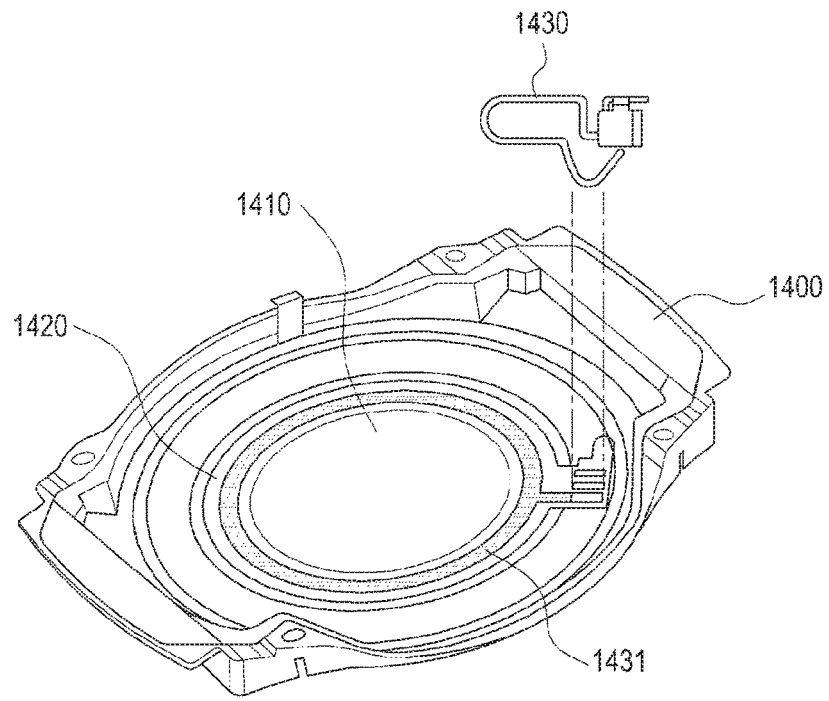
FIG. 14 is a diagram illustrating a component mounting structure of a wearable device according to an embodiment of the present disclosure.

FIG. 14 is a diagram illustrating a component mounting structure of a wearable device according to an embodiment of the present disclosure. Referring to FIG. 14, a wireless charging coil 1410, a contact pad 1420, a sensing pad 1431, and a contact terminal 1430 may be configured on the bottom of a body 1400 of the wearable device.

Figure 15:
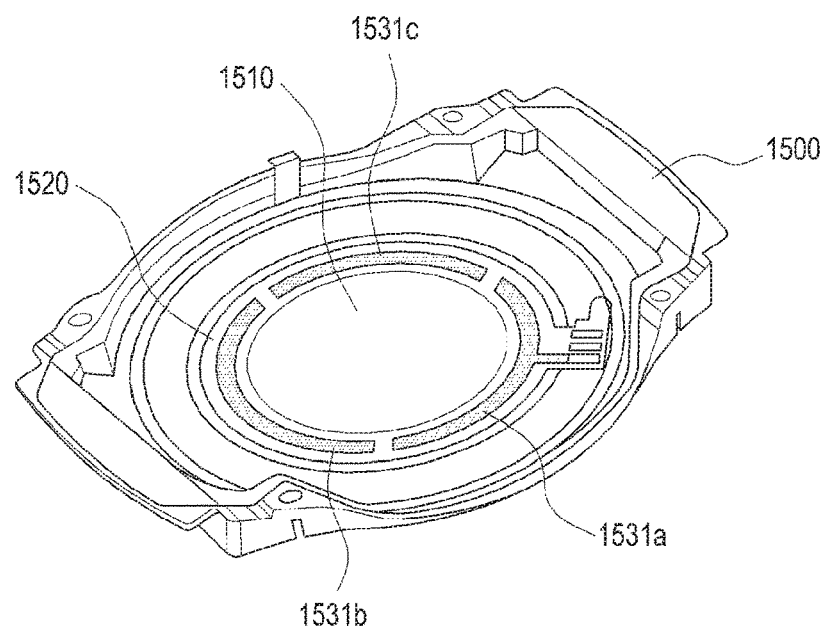
FIG. 15 is a diagram illustrating a component mounting structure of a wearable device according to an embodiment of the present disclosure.

FIG. 15 is a diagram illustrating a component mounting structure of a wearable device according to an embodiment of the present disclosure. Referring to FIG. 15, the sensing pad 1431 that is illustrated in FIG. 14 may be divided into a main sensing pad 1531a and first and second sub-sensing pads 1531b and 1531c.

The structure of the sensing pad, which includes the main sensing pad 1531a connected to a single detection channel and the sub-sensing pads 1531b and 1531c that are separated a predetermined distance from the main sensing pad, may be an optimum structure in the design of a micro-device, such as a wearable device, as illustrated. Since the wearable device is designed in a very small size so as to be worn on a human body, it may be difficult to ensure a space for mounting a contact terminal or a solder pad that electrically connects the sensing pad and a Printed Circuit Board (PCB). In FIG. 15, such a structure may be mounted in a body 1500 of the wearable device through optimization thereof.

Referring to FIG. 15, a wireless charging coil 1510, a contact pad 1520, and the plurality of sensing pads 1531a, 1531b, and 1531c are provided on the bottom of the body 1500 of the wearable device.

Figure 16:
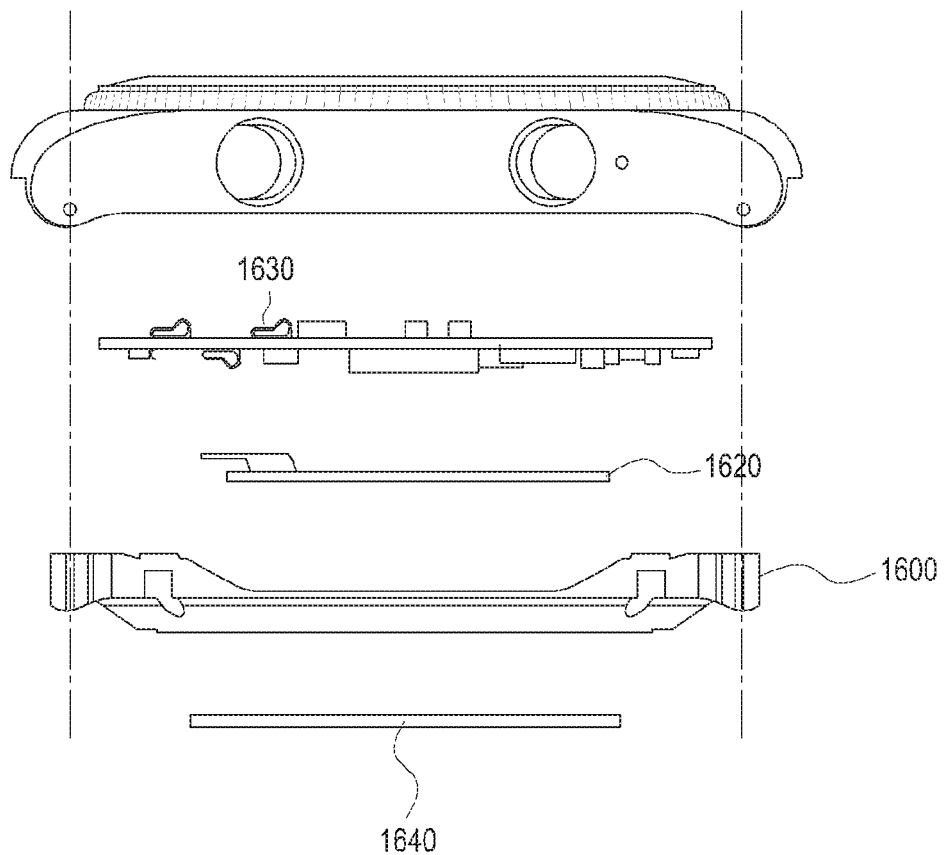
FIG. 16 is a diagram illustrating a component mounting structure of a wearable device according to an embodiment of the present disclosure.

FIG. 16 is a diagram illustrating a component mounting structure of a wearable device according to an embodiment of the present disclosure. Referring to FIG. 16, an FPCB 1620 may be mounted in a body 1600 of the wearable device and is connected to a contact terminal 1630 of a PCB. A plurality of sensing pads may be provided on a bottom of the body 1600 and may be brought into contact with a contact pad that is at least a part of the FPCB. A window deco 1640 may be further provided on the bottom of the body 1600.

A sensing pad of the circular FPCB may be mounted in the wearable device illustrated in FIG. 16, and a main sensing pad and a sub-sensing pad may be formed to be separated from each other, which makes it possible to recognize various states in which a user wears the wearable device. By configuring a sensing pad unit that includes a main sensing pad and at least one sub-sensing pad and determining a change in capacitance of each sensing pad due to a touch, contact, or proximity, according to an embodiment of the present disclosure, it is possible to determine a point where the wearable device is brought into contact with a human body, or a degree to which the wearable device is brought close to the human body, thereby recognizing various states in which the user wears the wearable device.

In FIG. 16, the circular FPCB 1620 may include a wireless charging coil, a sensing pad, etc., and may require a plurality of contact terminals (e.g., two contact terminals for wireless charging and two contact terminals for a capacitive sensor) in order to connect with the PCB.

If each sensing pad is connected to an independent detection channel, the contact terminals may require one pad for connecting three sensing pads and a ground pad, and two contact terminals may be additionally required.

Figure 17:
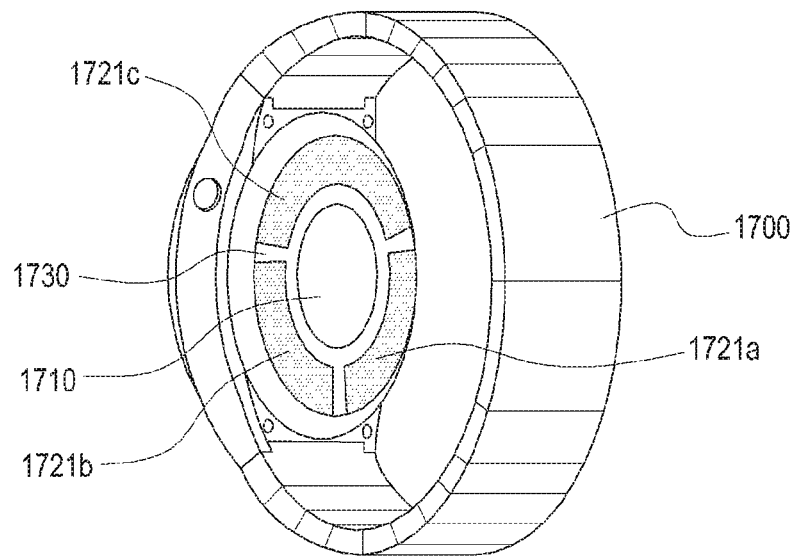
FIG. 17 is a diagram illustrating a component mounting structure of a wearable device according to an embodiment of the present disclosure.
Figure 18:
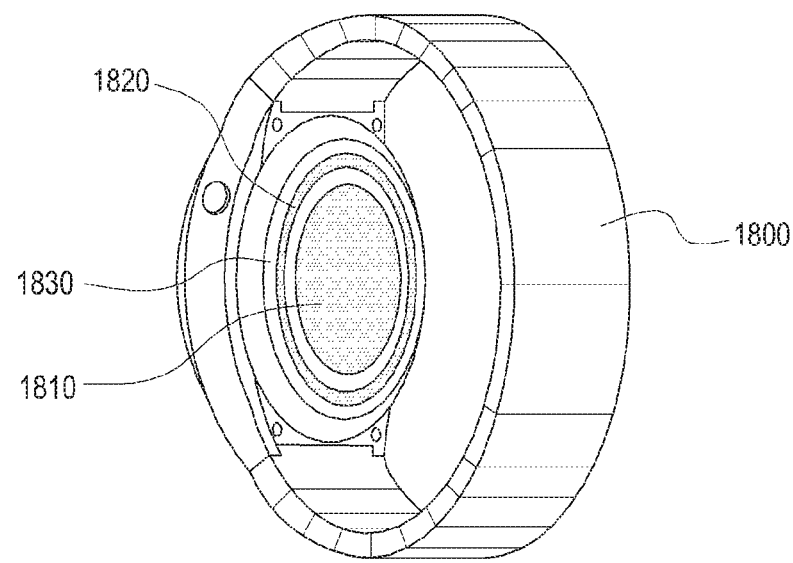
FIG. 18 is a diagram illustrating a component mounting structure of a wearable device according to an embodiment of the present disclosure.
Figure 19:
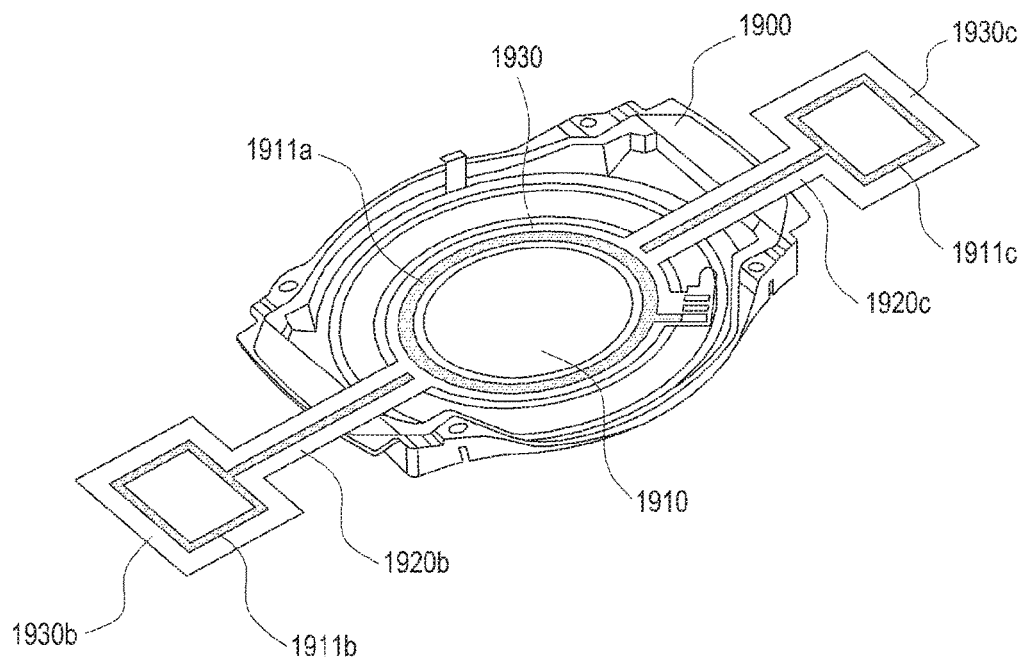
FIG. 19 is a diagram illustrating a component mounting structure of a wearable device according to an embodiment of the present disclosure.

According to an embodiment of the present disclosure, a sensing pad may also be configured by using external metal appearance of a wearable device as illustrated in FIGS. 17 to 19. FIG. 17 is a diagram illustrating an embodiment in which a plurality of separated sensing pads are disposed on the edge of a body of a wearable device in consideration of a window deco where a wireless charging coil is located, and FIG. 18 is a diagram illustrating an embodiment in which separated sensing pads are designed such that an Electro-CardioGram (ECG) signal may be measured thereby.

FIG. 17 is a diagram illustrating a component mounting structure of a wearable device according to an embodiment of the present disclosure.

Referring to FIG. 17, a wireless charging coil 1710 and a plurality of sensing pads 1721a, 1721b, and 1721c are disposed on a lower portion of a body of a wearable device 1700. The plurality of sensing pads 1721a, 1721b, and 1721c are each separated from each other with a dielectric space 1730 therebetween.

FIG. 18 is a diagram illustrating a component mounting structure of a wearable device according to an embodiment of the present disclosure.

Referring to FIG. 18, sensing pads 1810 and 1820 are disposed on a lower portion of a body of a wearable device 1800. Sensing pads 1810 and 1820 are separated from each other with a dielectric space 1830 therebetween. The main sensing pad 1810 is located in a center of the lower portion of the body, and the sub-sensing pad 1820 surrounds the main sensing pad 1810. At least one of the sensing pads 1810 and 1820 may be configured to measure an ECG signal.

FIG. 19 is a diagram illustrating a component mounting structure of a wearable device according to an embodiment of the present disclosure.

Referring to FIG. 19, a sensing pad may be configured by using a body and a strap of a wearable device in order to recognize various states in which a user wears the wearable device.

For example, a wireless charging coil 1910 and a main sensing pad 1911a may be disposed in an interior of a body 1900. An FPCB 1930 extends to the strap that is connected to opposite sides of the body 1900 in which the wireless charging coil 1910 and the main sensing pad 1911a are disposed. For example, the FPCB 1930 HAS extension pads 1920b and 1920c on portions of the body 1900 where the body 1900 and the strap are connected to each other, and sub-sensing pads 1911b and 1911c are disposed in strap extension areas 1930b and 1930c on opposite sides of the FPCB 1930, respectively. When the sensing pads 1911b and 1911c are configured on the strap portion as described above, the product may be configured in the shape of an FPCB 1930 into which extension pads 1920b and 1920c are inserted in consideration of a flexible characteristic. Further, the main sensing pad 1911a is separated a predetermined distance from each of the sub-sensing pads 1911b and 1911c through the extension pads 1920b and 1920c.

When a sensing pad unit is configured by using a main sensing pad and at least one sub-sensing pad according to an embodiment of the present disclosure, the areas of the sensing pads and the interval therebetween have to be effectively designed according to an available mounting space in an electronic device (e.g., a wearable device).

Further, unlike a main sensing pad, a sub-sensing pad is not directly connected to a circuit, but uses a coupling phenomenon with the main sensing pad. Therefore, a predetermined correlation between the main sensing pad and the sub-sensing pad may be formed.

The main sensing pad and the sub-sensing pad may have predetermined planes and minimum cross-sectional areas in at least one same layer, and the correlation between the sensing pads may be analyzed based on a relational expression which is described below.

Parasitic capacitance for touch events on a main sensing pad and a sub-sensing pad are described with reference to FIG. 20, and thereafter, equivalent circuits for the respective touch events are described with reference to FIGS. 21 and 22.

Figure 20:
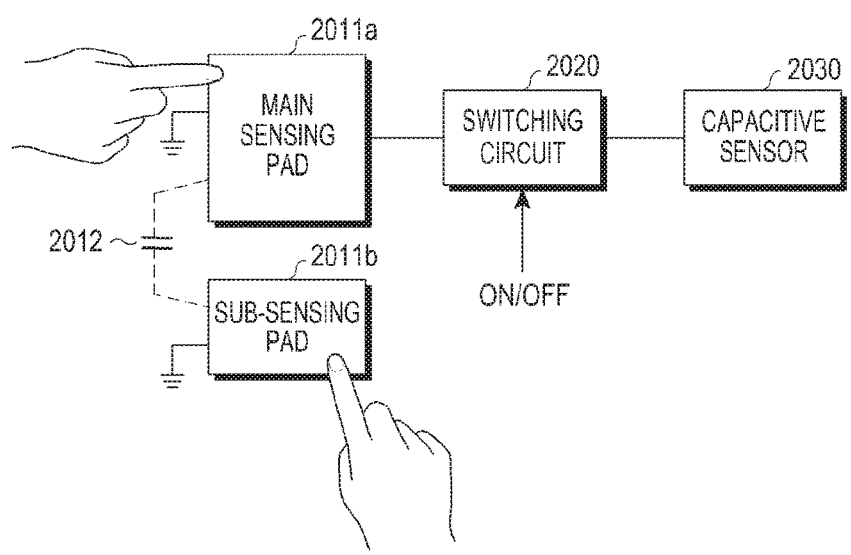
FIG. 20 is a diagram illustrating parasitic capacitance for sensing pads according to an embodiment of the present disclosure.

FIG. 20 is a diagram illustrating parasitic capacitance for sensing pads according to an embodiment of the present disclosure.

Referring to FIG. 20, a main sensing pad 2011a is directly connected to a capacitive sensor 2030 through a switching circuit 2020. Further, at least one sub-sensing pad 2011b is disposed to be spaced a preset distance apart from the main sensing pad 2011a. For example, coupling capacitance 2012 may be formed between the main sensing pad 2011a and the sub-sensing pad 2011b by predetermined coupling.

Figure 21:
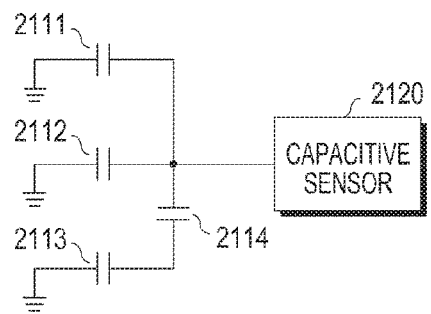
FIG. 21 is an equivalent circuit diagram of parasitic capacitance according to an embodiment of the present disclosure.
Figure 22:
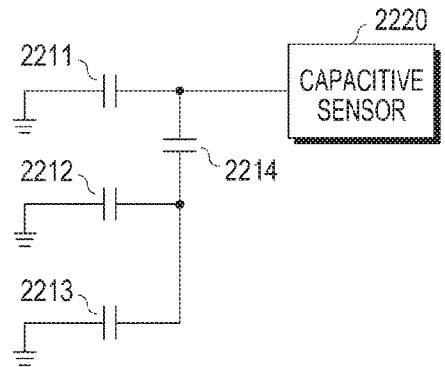
FIG. 22 is an equivalent circuit diagram of parasitic capacitance according to an embodiment of the present disclosure.

If a user touches the main sensing pad 2011a, an equivalent circuit, as illustrated in FIG. 21, may be calculated, and if the user touches the sub-sensing pad 2011b, an equivalent circuit, as illustrated in FIG. 22, may be calculated.

FIG. 21 is an equivalent circuit diagram of parasitic capacitance according to an embodiment of the present disclosure.

Referring to FIG. 21, when a user touches the main sensing pad 2011a in the circuit of FIG. 20, the total parasitic capacitance $C_{total}$, which is measured by a capacitive sensor 2120, may be calculated by Equation (1) below through a combination of capacitance 2111 ($C_f$) caused by the user's finger, capacitance 2112 ($C_{P1}$) caused by the main sensing pad, capacitance 2113 ($C_{P2}$) caused by the sub-sensing pad, and coupling capacitance 2114 ($C_c$) caused by coupling formed between the two sensing pads.

$$C_{total} = C_{P1} + C_f + \frac{1}{\frac{1}{C_c} + \frac{1}{C_{p2}}} \quad (1)$$

FIG. 22 is an equivalent circuit diagram of parasitic capacitance according to an embodiment of the present disclosure. Referring to FIG. 22, when a user touches the sub-sensing pad 2011b in the circuit of FIG. 20, the total parasitic capacitance $C_{total}$, which is measured by a capacitive sensor 2220, may be calculated according to Equation (2) below through a combination of capacitance 2213 ($C_f$) caused by the user's finger, capacitance 2211 ($C_{P1}$) caused by the main sensing pad, capacitance 2212 ($C_{P2}$) caused by the sub-sensing pad, and coupling capacitance 2214 ($C_c$) caused by coupling formed between the two sensing pads.

$$C_{total} = C_{P1} + \cfrac{1}{\cfrac{1}{C_c} + \cfrac{1}{C_{p2} + C_f}} \qquad (2)$$

Referring to Equations (1) and (2) above, even if a plurality of sensing pads are not connected to a circuit, a sensing pad on which a touch has been detected can be determined according to a variation in capacitance. Hereinafter, a more specific embodiment of the present disclosure is described.

For example, a correlation between the main sensing pad and the sub-sensing pad may be analyzed by substituting a specific value for each parasitic capacitance using Equations (1) and (2). In the following example according to an embodiment of the present disclosure, the parasitic capacitance caused by the main sensing pad and the parasitic capacitance caused by the finger have constant values of $C_{P1}=155$ and $C_f=3$, respectively. The correlation may be described as listed in Table 5 below by adjusting the remaining parasitic capacitance $C_{P2}$ and $C_c$.

TABLE 5

| | Case | $C_{P1}$ | $C_f$ | $C_{P2}$ | $C_c$ | Total Cap. (pF) | delta | Detectable (limit = 0.2) |
|---|---|---|---|---|---|---|---|---|
| If. $C_f=$ $C_{P2}=$ $C_c$ | Default [w/o Grip] | 155 | — | 3 | 3 | 156.5 | 0 | ○ |
| | Case [A] | 155 | 3 | 3 | 3 | 159.5 | 2 | ○ |
| | Case [B] | 155 | 3 | 3 | 3 | 157 | 0.5 | ○ |

When delta=|Default−Total Cap| is higher than the noise level (limit=0.2 pF) of a capacitive sensor in Table 5, whether a touch or grip is detected or not may be recognized. Accordingly, in the state of $C_f=C_{P2}=C_c$ in Table 5, whether a touch or grip is detected on each sensing pad can be identified.

Touch or grip detection results under different conditions are listed in Table 6 below.

TABLE 6

| | Case | $C_{P1}$ | $C_f$ | $C_{P2}$ | $C_c$ | Total Cap. (pF) | delta | Detectable (limit = 0.2) |
|---|---|---|---|---|---|---|---|---|
| If. $C_f \leq$ $C_{P2}$ | Default [w/o Grip] | 155 | — | 15 | 3 | 157.5 | 0 | ○ |
| | Case [A] | 155 | 3 | 15 | 3 | 160.5 | 3 | ○ |
| | Case [B] | 155 | 3 | 15 | 3 | 157.57 | 0.07 | x |
| If. $C_f \geq C_c$ | Default [w/o Grip] | 155 | — | 3 | 2 | 156.3 | 0 | ○ |
| | Case [A] | 155 | 3 | 3 | 2 | 159.3 | 3 | ○ |
| | Case [B] | 155 | 3 | 3 | 2 | 156.5 | 0.2 | x |

Design conditions of sensing pads through equations in Table 6 above may be set according to Equation (3) below.

$$C_{P1} \gg C_{P2}, C_f \geq C_{P2}, C_f \leq C_c \qquad (3)$$

Referring to Equation (3), for $C_f \leq C_c$, the interval between the main sensing pad and the sub-sensing pad may be designed such that the sensing pads closely approach each other within a distance by which coupling can be generated, and for $C_f \geq C_{P2}$, the sub-sensing pad may be designed in the shape of a line, the planar area of which is less than the area of the main sensing pad.

Figure 23:
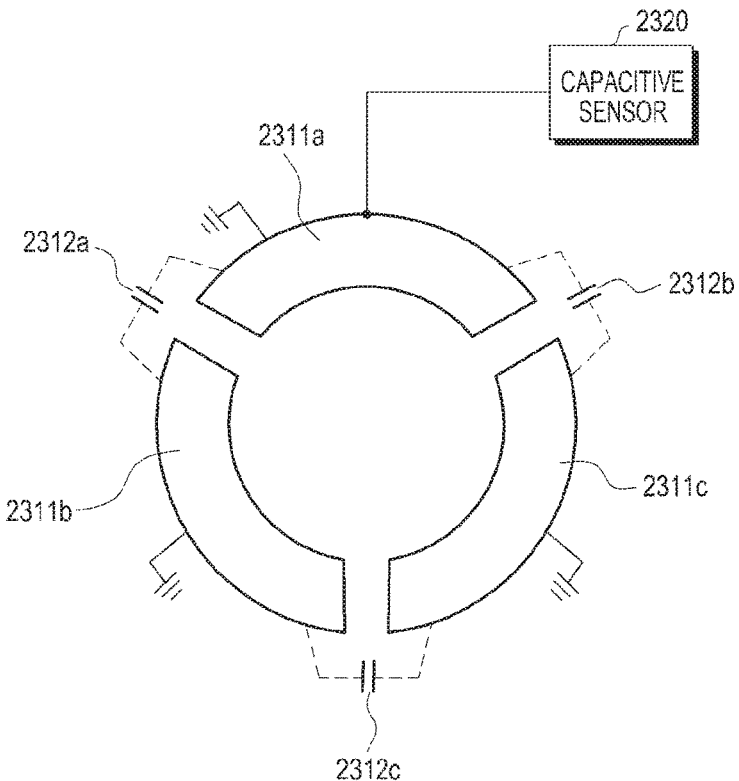
FIG. 23 is a diagram illustrating a design structure of sensing pads in a wearable device according to an embodiment of the present disclosure.

FIG. 23 is a diagram illustrating a design structure of sensing pads in a wearable device according to an embodiment of the present disclosure.

Referring to FIG. 23, a main sensing pad 2311a and a plurality of sub-sensing pads 2311b and 2311c may be configured in a circular shape within the wearable device.

The main sensing pad 2311a is connected to a capacitive sensor 2320, and the sub-sensing pads 2311b and 2311c is separated a preset distance from the main sensing pad 2311a. The sensing pads are separated from each other as illustrated so that coupling capacitance 2312a, 2312b, and 2312c may be generated between the adjacent sensing pads.

The capacitance $C_{P1}$ of the main sensing pad 2311a, the capacitance $C_{P2}$ and $C_{P3}$ of the sub-sensing pads 2311b and 2311c, and the coupling capacitance $C_{c1}$, $C_{c2}$, and $C_{c3}$ between the sensing pads are configured according to Equations (4) and (5) below.

$$C_{P1} \gg C_{P2} \text{ or } C_{P3}, C_f \geq C_{P2} \text{ or } C_{P3}, C_f \leq C_{c1} \text{ or } C_{c2} \qquad (4)$$

When the condition of Equation (4) above is satisfied, different conditions, such as Equation (5) below, are used to determine the location of a touch input.

$$C_{P2} \neq C_{P3} \text{ or } C_{c1} \neq C_{c2} \neq C_{c3} \qquad (5)$$

Figure 24:
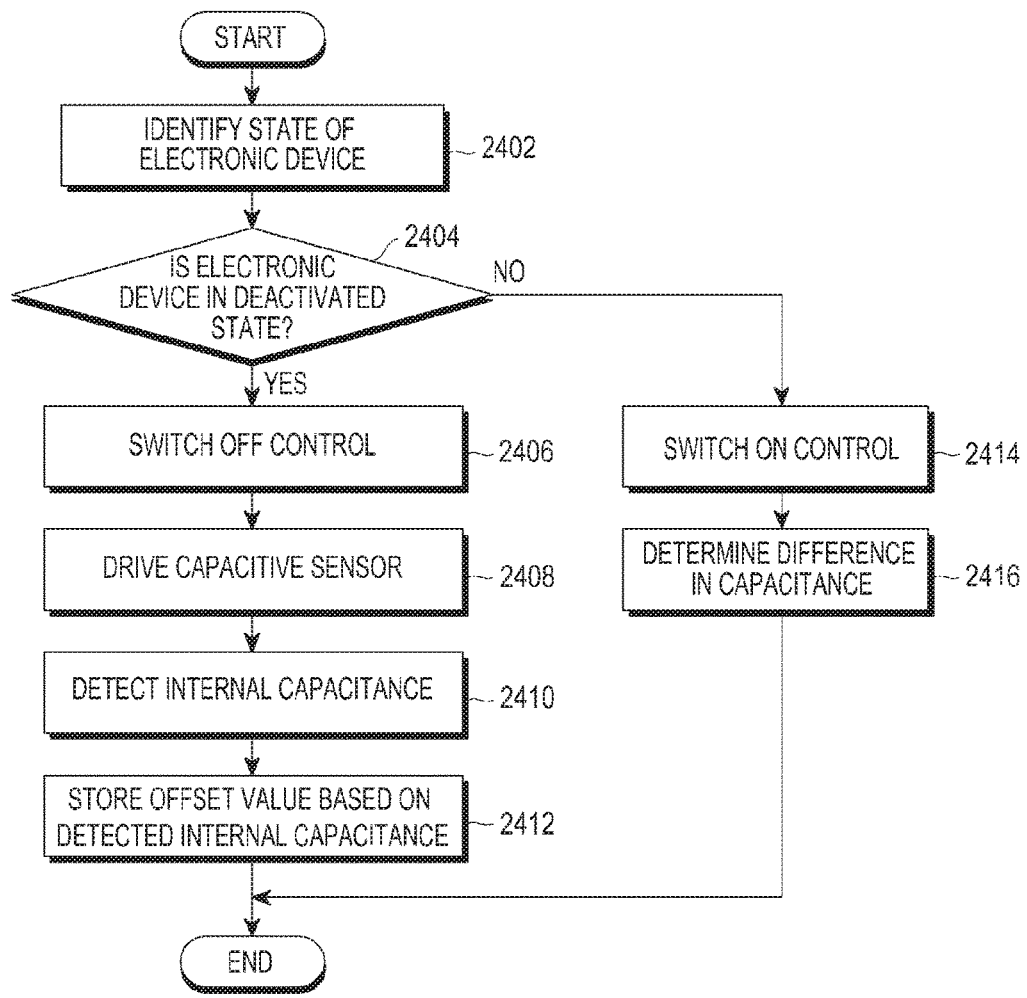
FIG. 24 is a flowchart illustrating a procedure of determining a touch in an electronic device according to an embodiment of the present disclosure.

FIG. 24 is a flowchart illustrating a method of determining a touch in an electronic device according to an embodiment of the present disclosure.

Referring to FIG. 24, in step 2402, a change of state of the electronic device is detected through a processor. According to an embodiment of the present disclosure, a connection provided via a switch may be turned on/off through the processor in response to the change of state of the electronic device.

For example, when it is determined in step 2404 that the electronic device is deactivated state, the processor controls the switch to be turned off, in step 2406. When a capacitive sensor is driven in step 2408, internal capacitance is detected, in step 2410.

In step 2412, an offset value is stored based on the detected internal capacitance, whereby the calibration for the capacitive sensor may be performed.

When it is determined in step 2404 that the electronic device is not in a deactivated state, the processor controls the switch to be turned on in step 2414, and determines a difference in the capacitance in step 2416 to determine whether a touch is detected.

As described above, according to embodiments of the present disclosure, internal capacitance and external capacitance may be measured through the capacitive sensor by controlling the switching circuit. A preset function may be performed in response to the result obtained by measuring the internal capacitance and the external capacitance. The preset function may include updating an offset value and a threshold value, on the basis of whether a touch is detected, as described above, and may include calculating the difference between the internal capacitance and the external capacitance and determining whether a user's touch or grip is detected.

Figure 25:
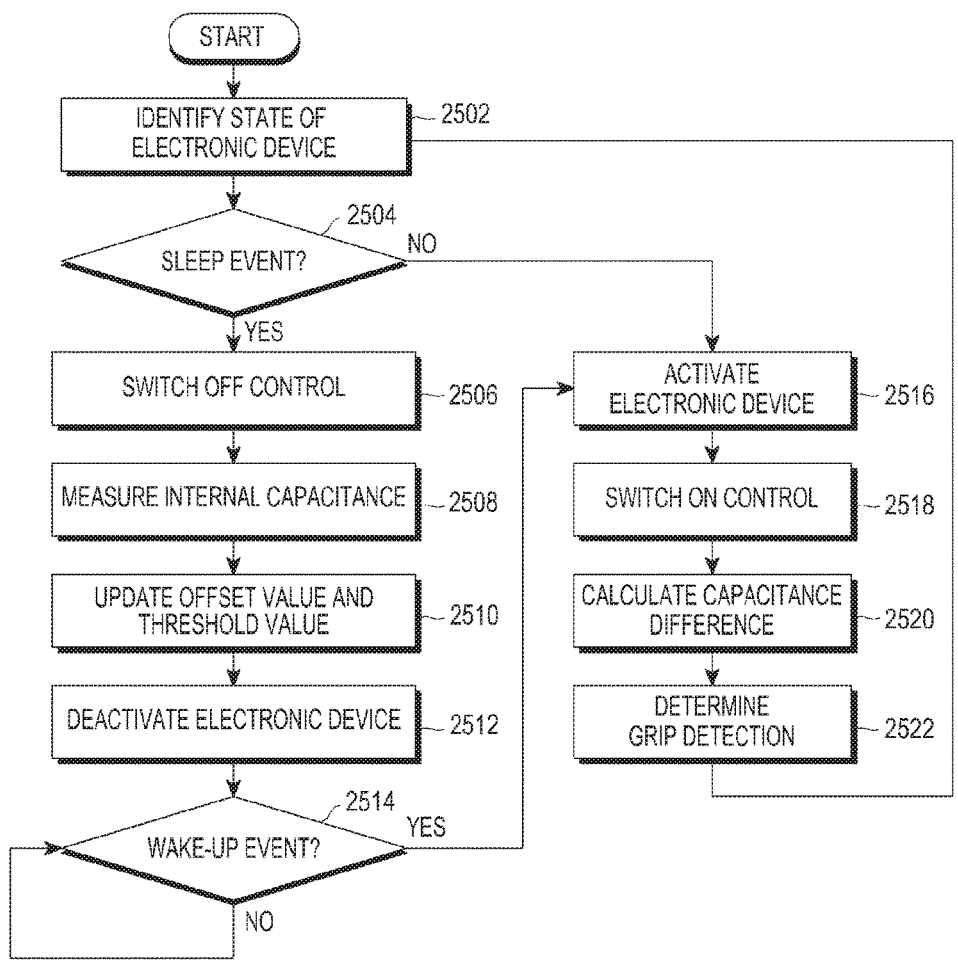
FIG. 25 is a flowchart illustrating a procedure of determining a touch in an electronic device according to an embodiment of the present disclosure.

FIG. 25 is a flowchart illustrating a method of determining a touch in an electronic device according to an embodiment of the present disclosure.

Referring to FIG. 25, in step 2502, the state of the electronic device is identified. When it is determined in step 2504 that the state of the electronic device corresponds to a sleep event, a connection provided via a switch is turned off, in step 2506. When the connection provided via the switch is turned off, internal capacitance is measured in step 2508, and an offset value and a threshold value are updated, in step 2510.

In step 2512, the electronic device is deactivated, and when a wake-up event occurs, in step 2514, the electronic device is re-activated again, in step 2516.

When it is determined in step 2504 that the state of the electronic device does not correspond to a sleep event, or when a wake-up event occurs in step 2514, the electronic device is re-activated, in step 2516, and the connection provided by the switch is turned on, in step 2518. A difference in the capacitance is calculated in step 2520, and a determination of whether a touch or grip is detected is performed based on the calculated capacitance difference, in step 2522.

Hereinafter, examples of electronic devices and wearable devices in accordance with embodiments of the present disclosure are described with reference to FIGS. 26 and 27.

Figure 26:
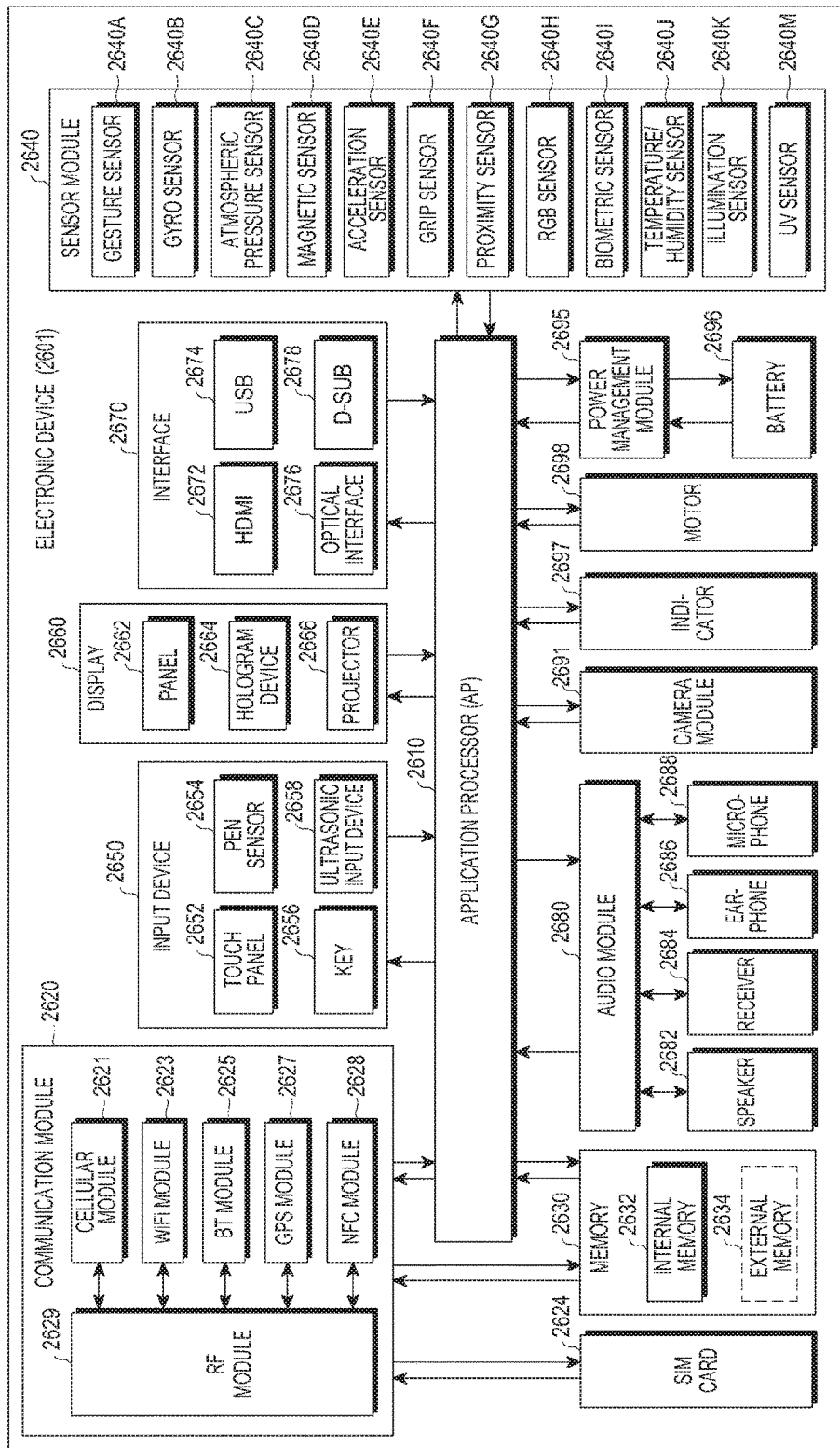
FIG. 26 is a block diagram illustrating a detailed structure of an electronic device according to an embodiment of the present disclosure.

FIG. 26 is a block diagram of an electronic device 2601 according to an embodiment of the present disclosure. The electronic device 2601 may include, for example, all or a part of the electronic devices illustrated in FIGS. 5 to 9. The electronic device 2601 includes at least one Application Processor (AP) 2610, a communication module 2620, a Subscriber Identification Module (SIM) card 2624, a memory 2630, a sensor module 2640, an input device 2650, a display 2660, an interface 2670, an audio module 2680, a camera module 2691, a power management module 2695, a battery 2696, an indicator 2697, and a motor 2698.

The AP 2610 may control a plurality of hardware or software elements connected thereto by driving, for example, an operating system or an application program and may perform a variety of data processing and calculations. The AP 2610 may be embodied as, for example, a System on Chip (SoC). According to an embodiment of the present disclosure, the AP 2610 may further include a Graphic Processing Unit (GPU) and/or an image signal processor. The AP 2610 may also include at least a part (e.g., a cellular module 2621) of other elements illustrated in FIG. 26. The AP 2610 may load instructions or data, which are received from at least one of the other elements (e.g., a non-volatile memory), in a volatile memory to process the loaded instructions or data, and may store various types of data in a non-volatile memory.

The communication module 2620 may have the same or a similar configuration as a configuration of a communication interface. The communication module 2620 includes, for example, a cellular module 2621, a Wi-Fi module 2623, a BT module 2625, a GPS module 2627, an NFC module 2628, and a Radio Frequency (RF) module 2629.

The cellular module 2621 may provide, for example, a voice call, video call, a text message service, an Internet service, or the like through a communication network. According to an embodiment of the present disclosure, the cellular module 2621 may identify and authenticate the electronic device 2601 in a communication network by using a subscriber identification module card 2624. The cellular module 2621 may perform at least some of the functions provided by the AP 2610. According to an embodiment of the present disclosure, the cellular module 2621 may include a Communication Processor (CP).

The Wi-Fi module 2623, the BT module 2625, the GPS module 2627, and the NFC module 2628 may include, for example, a processor for processing data transmitted/received through the corresponding module. According to an embodiment of the present disclosure, two or more of the cellular module 2621, the Wi-Fi module 2623, the BT module 2625, the GPS module 2627, and the NFC module 2628 may be included in one Integrated Chip (IC) or an IC package.

The RF module 2629 may transmit/receive, for example, a communication signal (e.g., an RF signal). The RF module 2629 may include, for example, a transceiver, a Power Amp Module (PAM), a frequency filter, a Low Noise Amplifier (LNA), an antenna, etc. According to another embodiment of the present disclosure, at least one of the cellular module 2621, the WI-FI module 2623, the BT module 2625, the GPS module 2627, and the NFC module 2628 may transmit/receive an RF signal through a separate RF module.

The SIM card 2624 may be a card that includes a subscriber identification module and/or an embedded SIM, and may contain unique identification information (e.g., an Integrated Circuit Card Identifier (ICCID)) or subscriber information (e.g., an International Mobile Subscriber Identity (IMSI)).

The memory 2630 includes, for example, an internal memory 2632 and an external memory 2634. The internal memory 2632 may include at least one of, for example, a volatile memory (e.g., a Dynamic Random Access Memory (DRAM), a Static RAM (SRAM), a Synchronous Dynamic RAM (SDRAM), etc.) and a non-volatile memory (e.g., a One Time Programmable Read Only Memory (OTPROM), a Programmable ROM (PROM), an Erasable and Programmable ROM (EPROM), an Electrically Erasable and Programmable ROM (EEPROM), a mask ROM, a flash ROM, a flash memory (e.g., a NAND flash memory, a NOR flash memory, etc.), a hard disc drive, and a Solid State Drive (SSD)).

The external memory 2634 may further include a flash drive, for example, a Compact Flash (CF), a Secure Digital (SD), a Micro Secure Digital (Micro-SD), a Mini Secure Digital (Mini-SD), an eXtreme Digital (xD), a memory stick, or the like. The external memory 2634 may be functionally and/or physically connected to the electronic device 2601 through various interfaces.

The sensor module 2640 may, for example, measure a physical quantity or detect an operating state of the electronic device 2601, and may convert the measured or detected information to an electrical signal. The sensor module 2640 includes, for example, a gesture sensor 2640A, a gyro sensor 2640B, an atmospheric pressure sensor 2640C, a magnetic sensor 2640D, an acceleration sensor 2640E, a grip sensor 2640F, a proximity sensor 2640D, a color sensor 2640H (e.g., a Red, Green, and Blue (RGB) sensor), a biometric sensor 2640I, a temperature/humidity sensor 2640J, an illumination sensor 2640K, and an Ultra Violet (UV) sensor 2640M. Additionally or alternatively, the sensor module 2640 may include, for example, an E-nose sensor, an ElectroMyoGraphy (EMG) sensor, an ElectroEncephaloGram (EEG) sensor, an ECG sensor, an IR sensor, an iris scanner, and/or a fingerprint sensor. The sensor module 2640 may further include a control circuit for controlling at least one sensor included therein. According to an embodiment of the present disclosure, the electronic device 2601 may further include a processor that is configured, as a part of the AP 2610 or a separate element from the AP 2610, to control the sensor module 2610, and may control the sensor module 2640 while the AP 2610 is in a sleep state.

The input device 2650 may include, for example, a touch panel 2652, a (digital) pen sensor 2654, a key 2656, or an ultrasonic input device 2658. The touch panel 2652 may use at least one of, for example, a capacitive type, a resistive type, an infrared type, and an ultrasonic type. In addition, the touch panel 2652 may further include a control circuit. The touch panel 2652 may further include a tactile layer to provide a tactile reaction to a user.

The (digital) pen sensor 2654 may be, for example, a part of a touch panel, or may include a separate recognition sheet. The key 2656 may include, for example, a physical button, an optical key, or a keypad. The ultrasonic input device 2658 may identify data by detecting sound waves with the microphone 2880 in the electronic device 2601 through an input tool that generates ultrasonic signals.

The display 2660 includes a panel 2662, a hologram device 2664, or a projector 2666. The panel 2662 may be embodied to be, for example, flexible, transparent, or wearable. The panel 2662, together with the touch panel 2652, may also be configured as a single module. The hologram device 2664 may show a stereoscopic image in the air by using interference of light. The projector 2666 may project light onto a screen to display an image. For example, the screen may be located in the interior or on the exterior of the electronic device 2601. According to an embodiment of the present disclosure, the display 2660 may further include a control circuit for controlling the panel 2662, the hologram device 2664, or the projector 2666.

The interface 2670 includes, for example, a High-Definition Multimedia Interface (HDMI) 2672, a Universal Serial Bus (USB) 2674, an optical interface 2676, or a D-subminiature (D-sub) 2678. The interface 2670 may include, for example, a Mobile High-definition Link (MHL) interface, a Secure Digital (SD) card/Multi-Media Card (MMC) interface, or an Infrared Data Association (IrDA) interface.

The audio module 2680 may convert a sound into an electrical signal, and vice versa. At least some elements of the audio module 2680 may process voice information input or output, for example, through a speaker 2682, a receiver 2684, earphones 2686, the microphone 2688, or the like.

The camera module 2691 may take, for example, a still image or a moving image, and according to one embodiment, the camera module 2691 may include one or more image sensors (e.g., a front sensor or a rear sensor), a lens, an Image Signal Processor (ISP), or a flash (e.g., an LED or a xenon lamp).

The power management module 2695 may manage, for example, the power of the electronic device 2601. According to an embodiment of the present disclosure, the power management module 2695 may include a Power Management Integrated Circuit (PMIC), a charger Integrated Circuit (IC), or a battery gauge. The PMIC may have a wired and/or wireless charging scheme. Examples of the wireless charging method may include, for example, a magnetic resonance method, a magnetic induction method, an electromagnetic wave method, and the like. An additional circuit (e.g., a coil loop, a resonance circuit, a rectifier, etc.) for wireless charging may be further included. The battery gauge 2696 may measure, for example, the residual quantity of the battery 2696 and a charging voltage, current, or temperature. The battery 2696 may include, for example, a rechargeable battery and/or a solar battery.

The indicator 2697 may indicate a particular state of the electronic device 2601 or a part thereof (e.g., the AP 2610), for example, a booting state, a message state, a charging state, or the like. The motor 2698 may convert an electrical signal into a mechanical vibration, and may generate a vibration or haptic effect. Although not illustrated, the electronic device 2601 may include a processing device (e.g., a GPU) for supporting mobile TV. The processing device for supporting mobile TV may process media data according to a standard of Digital Multimedia Broadcasting (DMB), Digital Video Broadcasting (DVB), media flow, or the like.

Each of the components of the electronic device according to the present disclosure may be implemented by one or more components and the name of the corresponding component may vary depending on a type of the electronic device. In various embodiments, the electronic device may include at least one of the above-described elements. Some of the above-described elements may be omitted from the electronic device, or the electronic device may further include additional elements. Further, some of the components of the electronic device according to an embodiment of the present disclosure may be combined to form a single entity, and thus, may equivalently execute functions of the corresponding elements prior to the combination.

Figure 27:
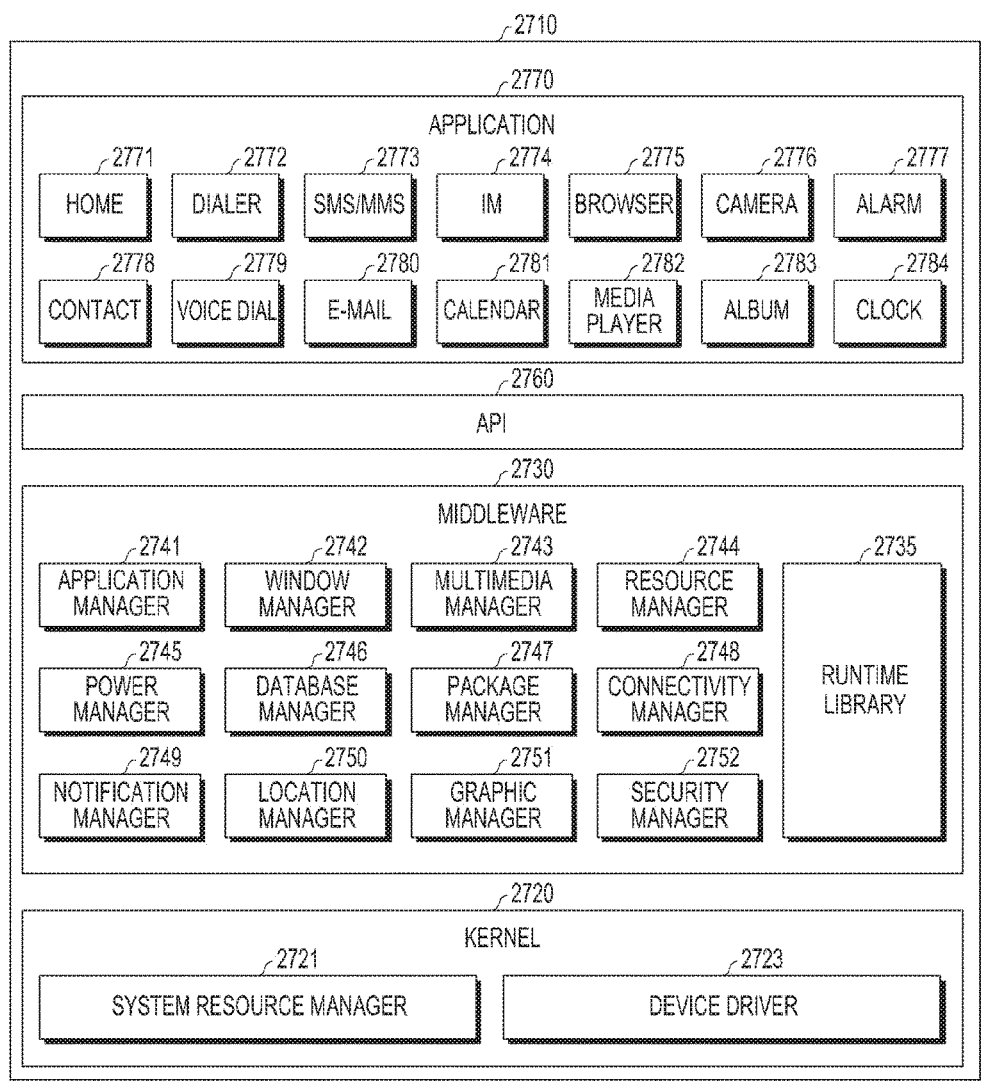
FIG. 27 is a block diagram of a program module according to an embodiment of the present disclosure.

FIG. 27 is a block diagram of a program module 2710 according to an embodiment of the present disclosure. According to one embodiment, the program module 2710 may include an Operating System (OS) that controls resources relating to an electronic device (e.g., the electronic devices of FIGS. 5 to 9) and/or various applications that are driven on the operating system. The operating system may be, for example, Android, iOS, Windows, Symbian, Tizen, Bada, etc.

The program module 2710 includes, for example, a kernel 2720, middleware 2730, an Application Programming Interface (API) 2760, and/or applications 2770. At least a part of the program module 2710 may be preloaded in the electronic device, or may be downloaded from a server (e.g., a server 106).

The kernel 2720 includes, for example, a system resource manager 2721 or a device driver 2723. The system resource manager 2721 may control, allocate, or collect the system resources. According to embodiment of the present disclosure, the system resource manager 2721 may include a process management unit, a memory management unit, a file system management unit, or the like. The device driver 2723 may include, for example, a display driver, a camera driver, a Bluetooth driver, a shared-memory driver, a USB driver, a keypad driver, a WI-FI driver, an audio driver, or an Inter-Process Communication (IPC) driver.

The middleware 2730 may, for example, provide a function required by the applications 2770 in common, or may provide various functions to the applications 2770 through the API 2760 so that the applications 2760 can efficiently use limited system resources in the electronic device. According to an embodiment of the present disclosure, the middleware 2730 (e.g., a middleware 143) may include at least one of a run time library 2735, an application manager 2741, a window manager 2742, a multimedia manager 2743, a resource manager 2744, a power manager 2745, a database manager 2746, a package manager 2747, a connectivity manager 2748, a notification manager 2749, a location manager 2750, a graphic manager 2751, and a security manager 2752.

The run time library 2735 may include, for example, a library module that a compiler uses in order to add new functions through a programming language while the applications 2770 are executed. The run time library 2735 may perform input/output management, memory management, or a function for an arithmetic function.

The application manager 2741 may, for example, manage a life cycle of at least one of the applications 2770. The window manager 2742 may manage a GUI resource used on a screen. The multimedia manager 2743 may identify a format required for reproducing various media files and may encode or decode a media file by using a codec appropriate for the corresponding format. The resource manager 2744 may manage resources, such as a source code, a memory, a storage space, or the like, of at least one of the applications 2770.

The power manager 2745 may operate together with, for example, a Basic Input/Output System (BIOS) to manage a battery or power, and may provide power information required for the operation of the electronic device. The database manager 2746 may generate, search for, or change a database to be used by at least one of the applications 2770. The package manager 2747 may manage the installation or the update of applications that are distributed in a package file form.

The connectivity manager 2748 may manage wireless connections, such as, for example, WI-FI, Bluetooth, or the like. The notification manager 2749 may display or notify of an event, such as a received message, an appointment, a proximity notification, and the like, to a user without disturbance. The location manager 2750 may manage location information of the electronic device. The graphic manager 2751 may manage graphic effects to be provided to a user and user interfaces related to the graphic effects. The security manager 2752 may provide various security functions required for system security or user authentication. According to an embodiment of the present disclosure, when the electronic device has a telephone call function, the middleware 2730 may further include a telephony manager for managing a voice or video call function of the electronic device.

The middleware 2730 may include a middleware module that forms a combination of various functions of the aforementioned elements. The middleware 2730 may provide modules specialized according to the types of operating systems in order to provide differentiated functions. In addition, the middleware 2730 may dynamically remove some of the existing elements, or may add new elements.

The API 2760, which is a set of API programming functions, may include different configurations according to operating systems. For example, when Android or iOS is running as an operating system of the electronic device, one API set may be provided to each platform, and when Tizen is the operating system, two or more API sets may be provided to each platform.

The applications 2770 include one or more applications that provide a function of a home screen 2771, a dialer 2772, an SMS/MMS 2773, an Instant Message (IM) 2774, a browser 2775, a camera 2776, an alarm 2777, contact 2778, a voice dial 2779, e-mail 2780, a calendar 2781, a media player 2782, an album 2783, a clock 2784, health care (e.g., measuring a work rate or blood sugar), providing environmental information (e.g., providing atmospheric pressure, humidity, or temperature information), etc.

According to an embodiment of the present disclosure, the applications 2770 may include an information exchange application that supports information exchange between the electronic device and an external electronic device. The information exchange application may include, for example, a notification relay application for transmitting predetermined information to the external electronic device, or a device management application for managing the external electronic device.

For example, the notification relay application may include a function of transferring, to an external electronic device, notification information generated from the other applications of the electronic device (e.g., the SMS/MMS application, the e-mail application, the health management application, and the environmental information application). Further, the notification relay application may receive, for example, notification information from an external electronic device and may provide the received notification information to a user. For example, the device management application may manage (e.g., install, delete, or update) at least one function of an external electronic device communicating with the electronic device (e.g., a function of turning on/off the external electronic device itself (or some components thereof) or a function of adjusting the brightness (or resolution) of the display), an application that operates in the external electronic device, or a service provided by the external electronic device (e.g., a telephone call service or a message service).

According to an embodiment of the present disclosure, the applications 2770 may include an application (e.g., health care application) that is specified according to the attribute of the external electronic device (e.g., the attribute of the electronic device, such as the type of electronic device which corresponds to a mobile medical device). The applications 2770 may include an application that is received from an external electronic device. The applications 2770 may include a preloaded application, or a third party application that can be downloaded from a server. The names of the components of the program module 2710 of the illustrated embodiment of the present disclosure may be changed according to the type of operating system.

According to embodiments of the present disclosure, at least a part of the programming module 2710 may be implemented in software, firmware, hardware, or a combination of two or more thereof. At least some of the programming module 2710 may be implemented (for example, executed) by, for example, the processor (for example, the AP 2610). At least some of the programming module 2710 may include, for example, a module, program, routine, sets of instructions, process, or the like for performing one or more functions.

The term "module" or "functional unit" used herein may, for example, mean a unit including one of hardware, software, and firmware or a combination of two or more of them. The term "module" may be interchangeably used with, for example, the term "unit", "logic", "logical block", "component", or "circuit". The terms "module" and "function unit" may refer to a minimum unit of an integrated component element or a part thereof. A module may be a minimum unit for performing one or more functions or a part thereof. A module or a function unit" may be mechanically or electronically implemented. For example, the "module" or "function unit" according to the an embodiment of the present disclosure may include at least one of an Application-Specific Integrated Circuit (ASIC) chip, a Field-Programmable Gate Arrays (FPGA), and a programmable-logic device for performing operations which has been known or are to be developed hereinafter.

According to embodiments of the present disclosure, at least some of the devices (e.g., modules or functions thereof) or the method (for example, operations) according to the present disclosure may be implemented by a command stored in a computer-readable storage medium in a programming module form. The instruction, when executed by a processor (e.g., the processor 560, 660, 770, 860, 950), may cause the one or more processors to execute the function corresponding to the instruction. The computer-readable storage medium may be, for example, the memory.

The computer readable recoding medium may include a hard disk, a floppy disk, magnetic media (e.g., a magnetic tape), optical media (e.g., a Compact Disc Read Only Memory (CD-ROM) and a Digital Versatile Disc (DVD)), magneto-optical media (e.g., a floptical disk), a hardware device (e.g., a Read Only Memory (ROM), a Random Access Memory (RAM), a flash memory), and the like. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

Any of the modules or programming modules according to embodiments of the present disclosure may include at least one of the above described elements, exclude some of the elements, or further include other additional elements. The operations performed by the modules, programming module, or other elements according to embodiments of the present disclosure may be executed in a sequential, parallel, repetitive, or heuristic manner. Further, some operations may be executed according to another order or may be omitted, or other operations may be added.

An electronic device according to an embodiment of the present disclosure, may include at least one sensing pad formed of a conductive material; a capacitive sensor that senses a touch or proximity of an object to the sensing pad by a value that is determined through the sensing pad; a switching circuit connected between the sensing pad and the capacitive sensor; and a processor turns on/off a connection provided by the switching circuit according to a preset condition.

An electronic device and a method of determining a touch in the electronic device, according to an embodiment of the present disclosure, can provide a low-power wearing recognition function using a self-capacitance measuring method in a wearable device.

Further, an electronic device and a method of determining a touch in the electronic device, according to an embodiment of the present disclosure, can improve component mounting efficiency in a wearable device using a sensing pad structure of a single detection channel.

In addition, an electronic device and a method of determining a touch in the electronic device, according to an embodiment of the present disclosure, can provide a function of recognizing various states in which a wearable device is worn by measuring the whole capacitance through a sensing pad structure in which a main sensing pad and a sub-sensing pad are separated from each other.

While the disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. An electronic device comprising:
    a housing that comprises a first surface, a second surface opposite to the first surface, and a side surface that surrounds at least part of a space between the first and second surfaces;
    a Radio Frequency (RF) communication circuit disposed in the housing;
    a first conductive member disposed in the housing;
    a switching circuit disposed in the housing;
    a sensor electrically connected to the first conductive member through the switching circuit and configured to detect at least one of contact and proximity of an external object to the first conductive member;
    a processor electrically connected to the RF communication circuit, the switching circuit, and the sensor; and
    a memory electrically connected to the processor,
    wherein the memory stores instructions that allow the processor, when being executed, to determine whether at least a part of the electronic device has been activated and to provide a first state in which the sensor and the first conductive member are electrically separated from each other when at least a part of the electronic device is deactivated and a second state in which the sensor and the first conductive member are electrically connected to each other when at least a part of the electronic device is activated, by using the switching circuit, and
    wherein the instructions allow the processor to acquire, by using the sensor, first data in the first state in which the sensor and the first conductive member are electrically separated from each other when the at least the part of the electronic device is deactivated, and second data in the second state in which the sensor and the first conductive member are electrically connected to each other when the at least the part of the electronic device is activated.

2. The electronic device of claim 1, wherein the instructions allow the processor to determine whether a user's body is in contact or near contact with the first conductive member at least partially based on the first data and the second data.

3. The electronic device of claim 2, wherein the instructions allow the processor to determine that the user's body is in contact with or near contact with the first conductive member when the difference between the first data and the second data exceeds a threshold value, and to determine that the user's body is not in contact with and is not in near contact with the first conductive member when the difference between the first data and the second data is less than a threshold value.

4. The electronic device of claim 1, wherein the instructions allow the processor to correct the second data at least partially based on the first data and to determine whether a user's body is in contact or near contact with the first conductive member at least partially based on the corrected second data.

5. The electronic device of claim 4, further comprising:
    an offset compensation circuit electrically connected between the switching circuit and the sensor and configured to store at least a part of the first data,
    wherein the instructions allow the processor to correct the second data using the offset compensation circuit.

6. The electronic device of claim 1, further comprising:
    a second conductive member insulated from the first conductive member.

7. The electronic device of claim 6, wherein capacitance $C_c$ formed between the first and second conductive members, capacitance $C_f$ formed between a user's body and the first conductive member and/or the second conductive member, parasitic capacitance $C_{P1}$ formed in the first conductive member, and parasitic capacitance $C_{P2}$ formed in the second conductive member satisfy at least one relation of $C_{P1} > C_{P2}$, $C_f \geq C_{P2}$, and $C_f \leq C_c$.

8. The electronic device of claim 6, further comprising:
    a third conductive member insulated from the first and second conductive members.

9. The electronic device of claim 8, wherein capacitance $C_{c1}$ formed between the first and second conductive members, capacitance $C_{c2}$ formed between the first and third conductive members, capacitance $C_{c3}$ formed between the second and third conductive members, capacitance $C_f$ formed between a user's body and the first conductive member, the second conductive member, and/or the third conductive member, parasitic capacitance $C_{P1}$ formed in the first conductive member, parasitic capacitance $C_{P2}$ formed in the second conductive member, and parasitic capacitance $C_{P3}$ formed in the third conductive member satisfy at least one relation of $C_{P1} > C_{P2}$ or $C_{P3}$, $C_f \geq C_{P2}$ or $C_{P3}$, $C_f \leq C_{c1}$ or $C_{c2}$, $C_{P2} \neq C_{P3}$, or $C_{c1} \neq C_{c2} \neq C_{c3}$.

10. The electronic device of claim 1, further comprising:
a printed circuit board disposed in the housing; and
a connecting member electrically connected between the first conductive member and the printed circuit board.

11. The electronic device of claim 10, wherein at least one of the RF communication circuit, the sensor, the switching circuit, the processor, and the memory is disposed on the printed circuit board.

12. The electronic device of claim 10, further comprising:
a protecting circuit electrically connected between the printed circuit board and the first conductive member and configured to interrupt at least part of static electricity that is applied to the antenna radiator and is introduced into the printed circuit board.

13. The electronic device of claim 1, wherein the switching circuit comprises at least one transistor, and is configured to perform a switching operation based on at least one signal that is applied to the at least one transistor.

14. The electronic device of claim 1, wherein the sensor is configured to detect a change in capacitance formed between the first conductive member and an external object, based on a signal that is generated from the sensor and returns thereto through the first conductive member.

15. An electronic device comprising:
a housing that comprises a first surface, a second surface opposite to the first surface, and a side surface that surrounds at least part of a space between the first and second surfaces;
a Radio Frequency (RF) communication circuit disposed in the housing;
an antenna radiator that forms at least part of at least one of the first surface, the second surface, and the side surface and is electrically connected to the RF communication circuit;
a sensor configured to detect whether an external object is in contact or near contact with the antenna radiator;
a switching circuit that comprises a first terminal electrically connected to the antenna radiator and a second terminal electrically connected to the sensor;
a processor electrically connected to the sensor and the switching circuit; and
a memory electrically connected to the processor,
wherein the memory stores instructions that allow the processor, when being executed, to receive a first measurement value from the sensor when the antenna radiator and the sensor are electrically connected to each other through the switching circuit and to receive a second measurement value from the sensor when the antenna radiator and the sensor are electrically separated from each other by the switching circuit, and
wherein the instructions allow the processor to determine whether the external object is in contact or near contact with the antenna radiator, by using the first and second measurement values.

16. The electronic device of claim 15, wherein the instructions allow the processor to at least temporarily store the second measurement value in the memory.

17. The electronic device of claim 15, wherein the RF communication circuit comprises an impedance matching circuit, and the impedance matching circuit is electrically connected to the second terminal of the switching circuit.

* * * * *